United States Patent
Saigoh

(10) Patent No.: US 7,205,594 B2
(45) Date of Patent: Apr. 17, 2007

(54) SEMICONDUCTOR DEVICE WITH CAPACITOR AND MANUFACTURING METHOD OF THE SAME

(75) Inventor: Kaoru Saigoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/785,953

(22) Filed: Feb. 26, 2004

(65) Prior Publication Data

US 2004/0173874 A1    Sep. 9, 2004

(30) Foreign Application Priority Data

Mar. 3, 2003    (JP)    ............... 2003-055684

(51) Int. Cl.
*H01L 29/76*    (2006.01)

(52) U.S. Cl. ............... 257/295; 257/213; 257/288; 438/3

(58) Field of Classification Search ............... 257/288, 257/295, 314, 346, 319, 318, 320, 321, 322, 257/323, 324, 525, 326; 438/3

See application file for complete search history.

(56) References Cited

U.S. PATENT DOCUMENTS 6,603,161 B2 *    8/2003    Kanaya et al.

FOREIGN PATENT DOCUMENTS

| JP | 2001-257320 | 9/2001 |
| JP | 2001-274353 | 10/2001 |
| JP | 2002-270788 | 9/2002 |

* cited by examiner

*Primary Examiner*—Nathan J. Flynn
*Assistant Examiner*—Kevin Quinto
(74) *Attorney, Agent, or Firm*—Westerman, Hattori, Daniels & Adrian, LLP.

(57) ABSTRACT

The present invention relates to a semiconductor device having capacitors. The configuration of the device includes: capacitor upper electrodes 14a, 14b formed via a dielectric film 13 on plate lines 12a that become capacitor lower electrodes; a conductive connecting sections 12b that are connected to one ends of the plate lines 12a and have contact regions; upper conductive patterns 14c that are formed between the contact regions and the edge of plate lines 12a on the dielectric film 13 on the conductive connecting sections 12b and are in the same layer as the capacitor upper electrodes 14a, 14b.

18 Claims, 21 Drawing Sheets

2T2C

1T1C

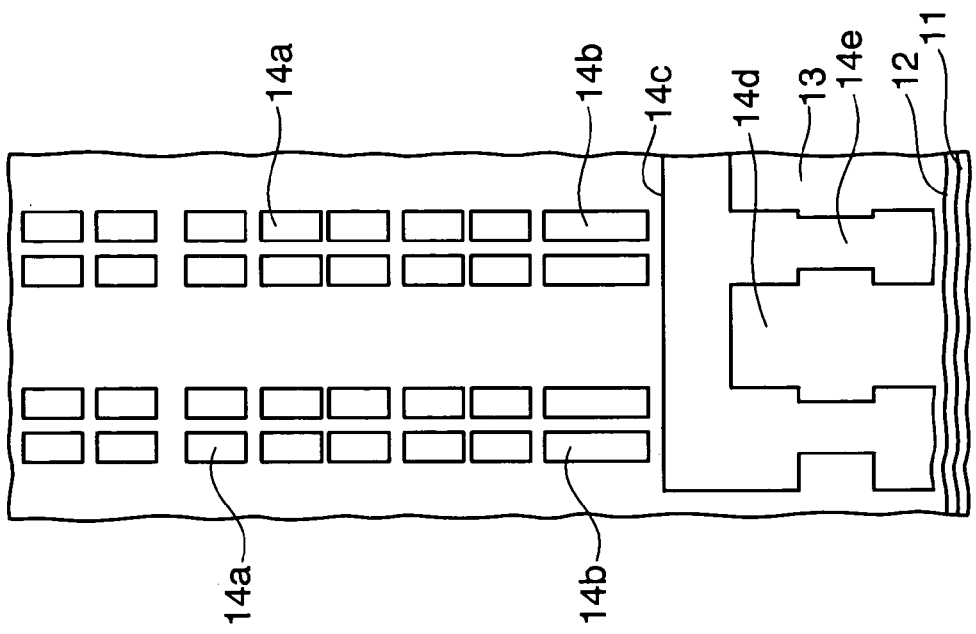
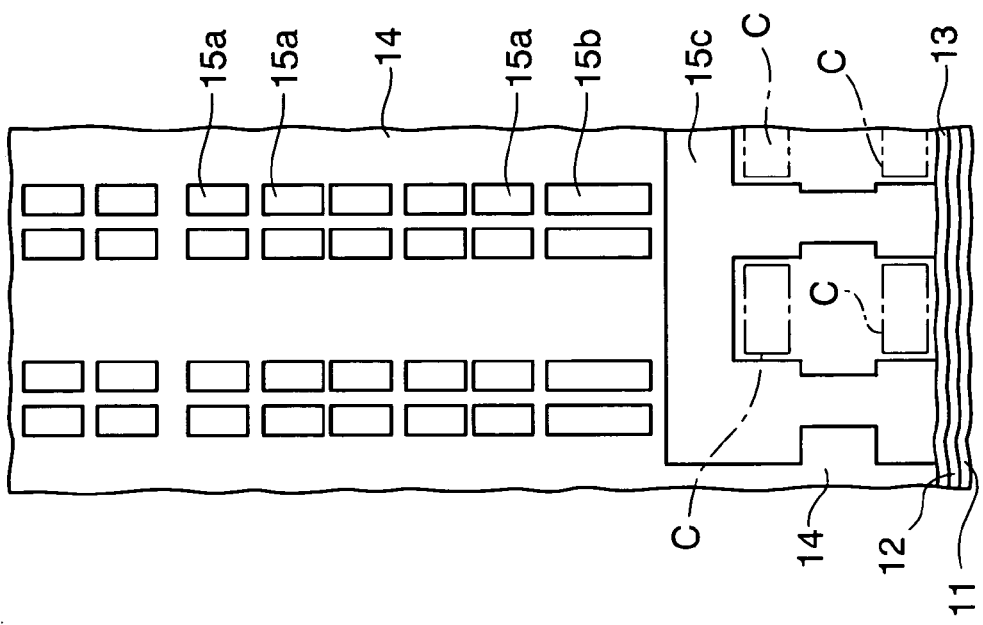

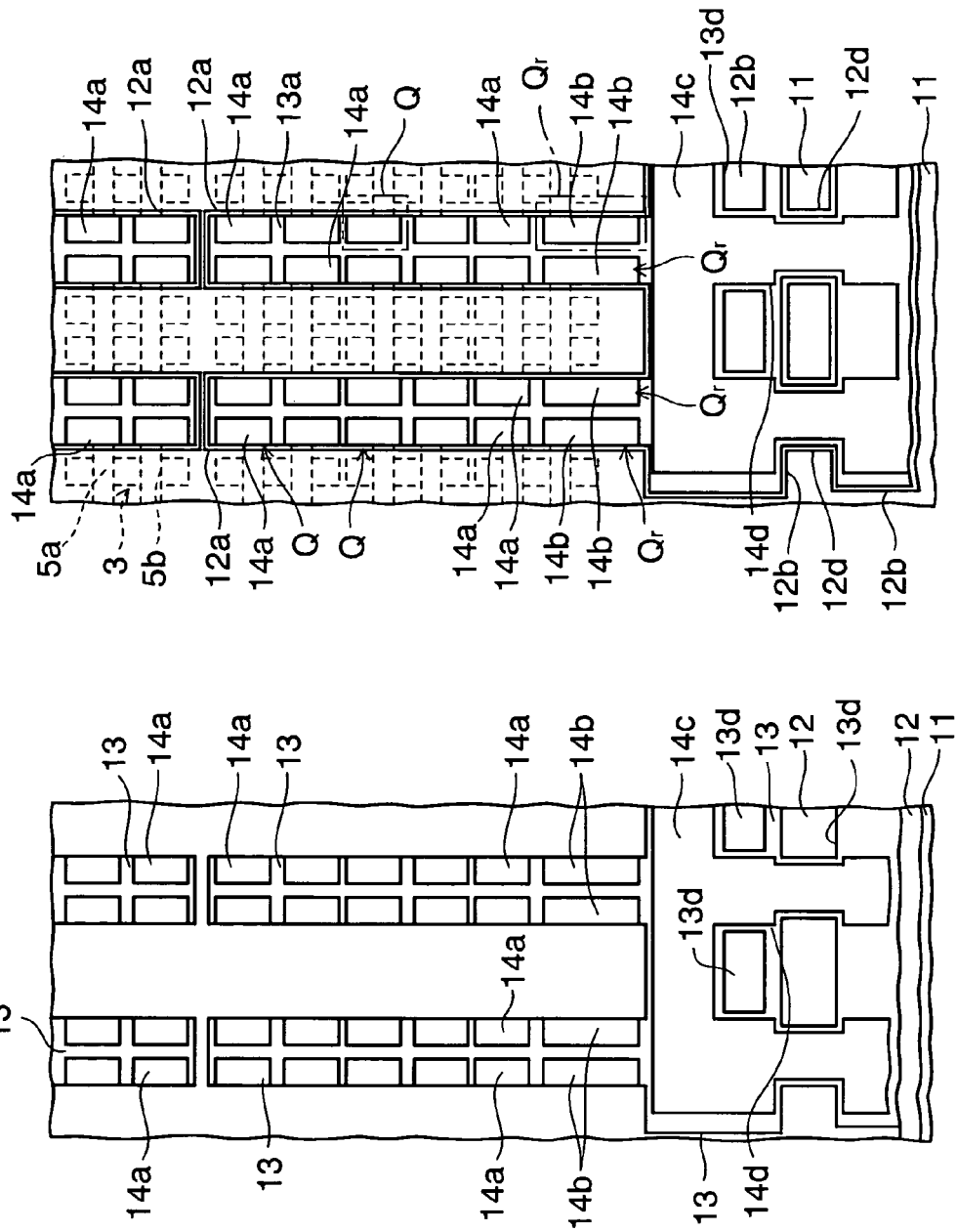

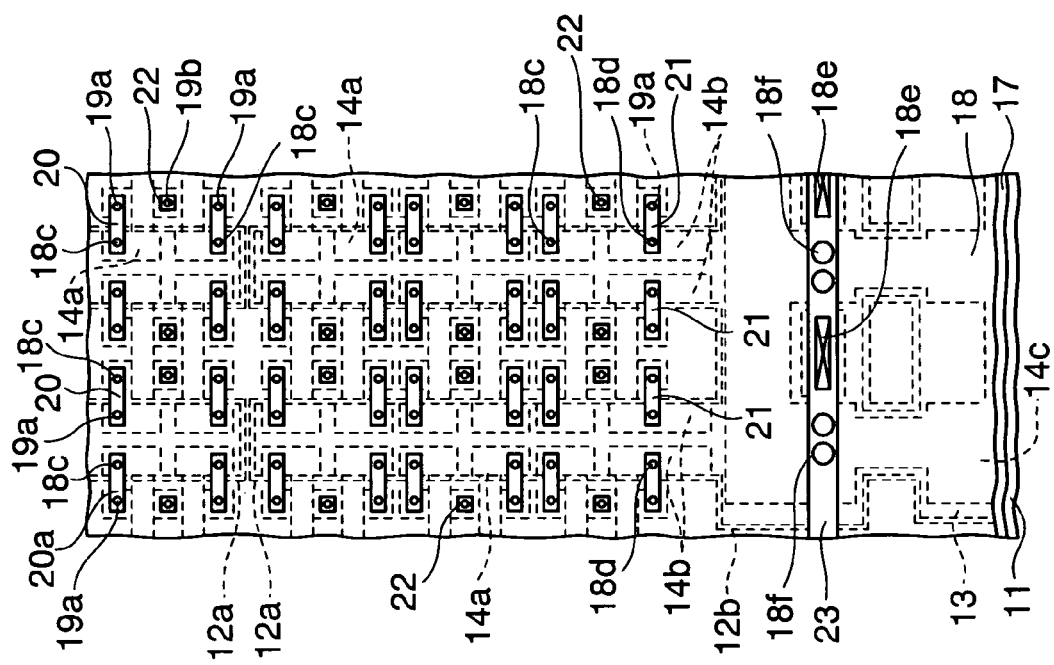

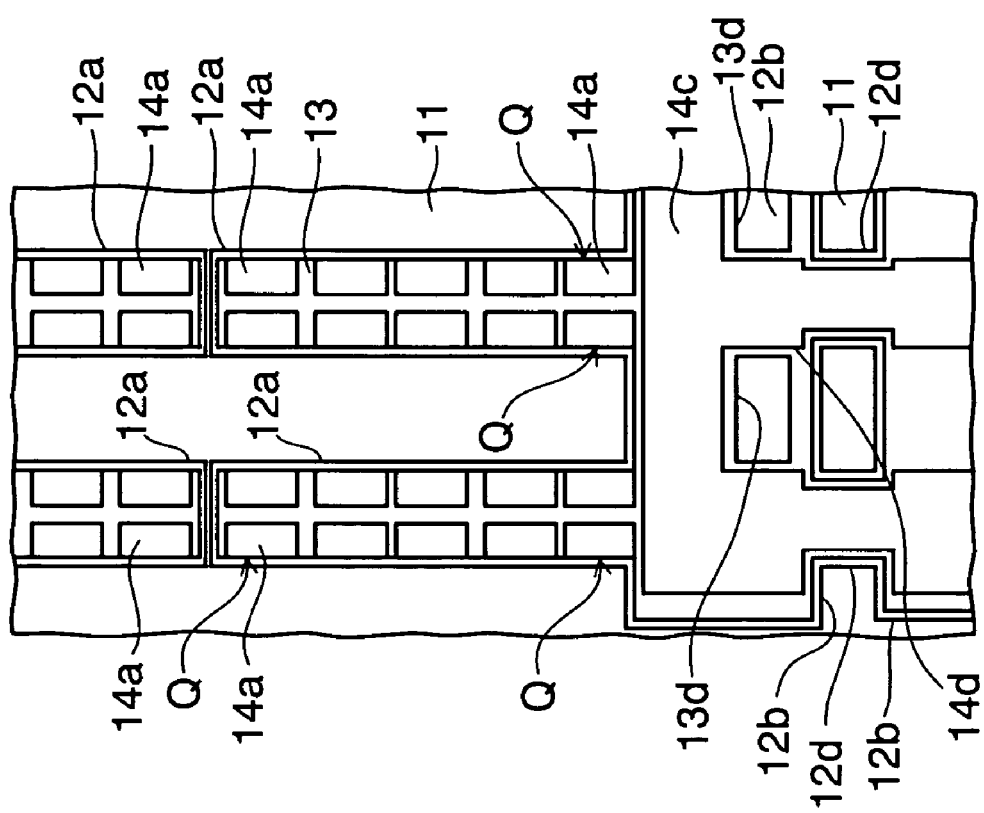

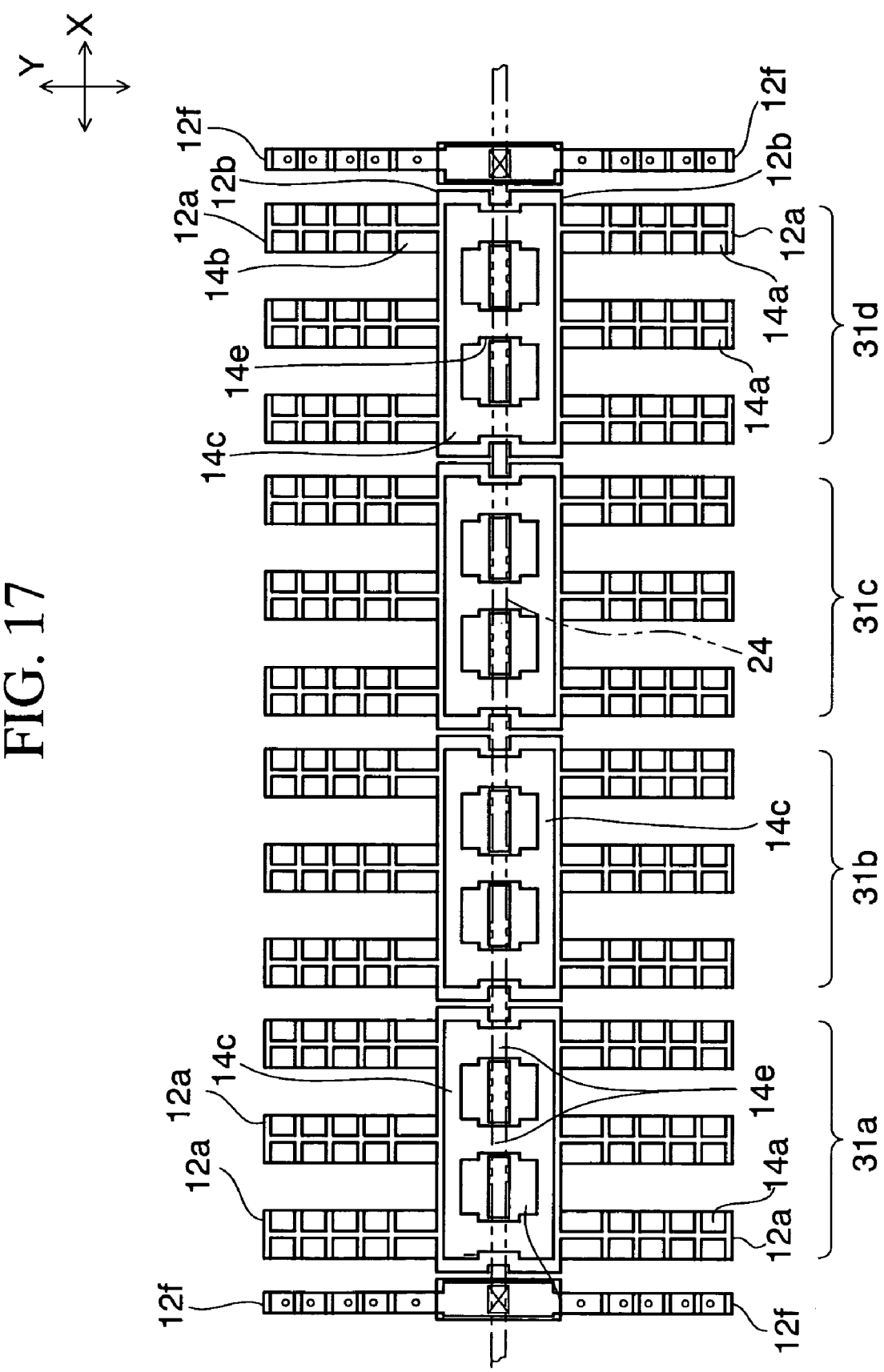

US 7,205,594 B2

SEMICONDUCTOR DEVICE WITH CAPACITOR AND MANUFACTURING METHOD OF THE SAME

CROSS-REFERENCE TO RELATED APPLICATIONS

This application is based upon and claims priority of Japanese Patent Application No. 2003-055684, filed on Mar. 3, 2003, the contents being incorporated herein by reference.

BACKGROUND OF THE INVENTION

1. Field of the Invention

The present invention relates to a semiconductor device having capacitors and a manufacturing method thereof.

2. Description of the Prior Art

There is known a FeRAM (Ferroelectric Random Access Memory) having a ferroelectric as a non-volatile memory capable of storing information even if a power source is turned off. The FeRAM has a structure that it stores information by using the hysteresis characteristics of the ferroelectric, which can be operated in high-speed and has low power consumption, and its future development is expected as a non-volatile memory of frequent rewriting.

FIGS. 1A and 1B show circuit diagram examples of the memory cell of the FeRAM.

FIG. 1A shows the circuit diagram of a type where two transistors $T_{11}$, $T_{12}$ and two capacitors $C_{11}$, $C_{12}$ are used in storing 1-bit information (hereinafter, referred to as 2T2C type). In the 2T2C type FeRAM memory cell, a complementary operation is performed that data of "1" or "0" is stored in one capacitor and opposite data is stored in another capacitor, the polarization state of the both capacitors $C_{11}$, $C_{12}$ is read out in determining the data, and the data is determined based on the difference between the polarizations.

FIG. 1B shows the circuit diagram of a type where one transistor $T_0$ and one capacitor $C_0$ are used in storing 1-bit information (hereinafter, referred to as 1T1C type). In the 1T1C type FeRAM memory cell, either data "1" or "0" is stored in one capacitor $C_0$, and has a reference capacitor $C_1$ generating a reference voltage in order to determine whether the information written in the memory cell is the data "1" or "0". One electrode that constitutes the reference capacitor $C_1$ is connected to a bit line BIT. Data is determined based on a magnitude relation between the potential of the capacitor $C_0$ and the potential of the reference capacitor $C_1$.

When the memory cell of 1T1C type and the memory cell of 2T2C type are compared, a cell area of 1T1C type having less number of capacitors can be reduced.

An example of the structure of a conventional memory cell will be described as follows.

FIG. 2 shows a plan view of the 2T2C type memory cell, and FIG. 3 shows a sectional view at I—I line thereof. Note that an interlayer insulating film on a semiconductor substrate is omitted from illustration.

In FIGS. 2 and 3, a plurality of active regions (wells) 103 surrounded by an element isolation layer 102 are formed vertically and horizontally at an interval with each other on the surface layer of a semiconductor substrate 101. On each active region 103, two gate electrodes 105, which combine word lines WL extending in a Y-direction, are formed via a gate insulating film 104. The word lines WL are extended on the element isolation insulating film 102. In each active region 103, the first to the third impurity diffusion regions 107a, 107b, 107c are formed in the active regions 103 at both sides of the two gate electrodes 105.

One gate electrode 105 and the impurity diffusion regions 107a, 107b on its both sides constitute a MOS transistor $T_0$, and another gate electrode 105 and the impurity diffusion regions 107b, 107c on its both sides constitute another MOS transistor $T_0$. In other words, the two transistors $T_0$ are formed on each active region 103. The transistors $T_0$ and the element isolation insulating film 102 are covered with an insulative cover film 108, and the first interlayer insulating layer 109 is formed on the insulative cover film 108.

A plurality of capacitor lower electrodes 111 of a striped shape are formed on the first interlayer insulating film 109 and over the element isolation insulating film 109 in an X-direction at an interval, a plurality of ferroelectric films 112 having substantially the same shape as the electrode 111 are formed on the capacitor lower electrodes 111, and a plurality of capacitor upper electrodes 113 are formed on the ferroelectric films 112 in a line in the Y-direction. One capacitor upper electrode 113, the ferroelectric film 112 and the capacitor lower electrode 111, which are under the electrode 113, constitute a capacitor C.

Further, a second interlayer insulating film 114 is formed on the capacitor C and the first interlayer insulating film 109. Then, the first to the third contact holes 114a, 114b, 114c are formed in the first and second interlayer insulating films 109, 114 and the insulative cover film 108, which correspond to areas above the impurity diffusion regions 107a, 107b, 107c in the active region 103. The first to the third conductive plugs 115a, 115b, 115c are respectively formed in the first to third contact holes 114a, 114b, 114c. Furthermore, the fourth contact hole 114d is formed in the second interlayer insulating film 114, which corresponds to an area above the capacitor upper electrode 113, and the fourth conductive plug 115d is formed in the contact hole.

The first metal wiring 116a for connecting the first conductive plug 114a to the adjacent fourth conductive plug 115d is formed on the second interlayer insulating film 114. Further, the second metal wiring 116c for connecting the third conductive plug 114c to the adjacent fourth conductive plug 115d is formed on the second interlayer insulating film 114. Thus, a plurality of the capacitor upper electrodes 113 formed in a line over each capacitor lower electrode 111 are connected to the MOS transistor $T_0$ one to one.

A metal pad 116b is formed on the second conductive plug 115b and on the second interlayer insulating film 114 around it. The metal pad 106b is connected to a bit line 117 that is to be formed over the pad via the third interlayer insulating film (not shown). The bit line 117 extends in a direction that intersects with each the word line WL and the capacitor lower electrode 111.

Incidentally, the 1T1C type memory cell also has a modified structure of the memory cell shown in FIGS. 2 and 3, and furthermore, a region where the reference capacitor is formed is required other than a memory cell region as shown in the following patent document 1.

Patent Document 1

Japanese Patent Laid-open No. 2002-270788 publication (Publication No. US-2002-0130345-A1) (FIG. 8)

Meanwhile, as shown in FIG. 4A, one end portion of the capacitor lower electrode 111 is provided with a contact region 120 for connecting electrically to a peripheral circuit. Then, the closest capacitor to the contact region 120 is used as a dummy capacitor $C_d$ because it is readily deteriorated.

A cause of the capacitor deterioration is a gentle reduction of the film thickness at the closest end portion of the upper electrode 113a to the contact region 120, which leads to an unstable capacitor characteristics.

The dummy capacitor $C_d$ where such deterioration readily occurs is formed at each of a plurality of the capacitor lower electrodes 111. It becomes a cause to reduce the degree of integration of effective capacitors C in the memory cell region.

SUMMARY OF THE INVENTION

It is an object of the present invention to provide a semiconductor device capable of increasing the degree of integration of capacitors for data storage use in a memory cell region, and a manufacturing method thereof.

According to one aspect of the present invention, there is provided a semiconductor device comprising: a first insulating film formed over the semiconductor substrate; two or more capacitor lower electrodes, which are formed over the first insulating film so as to extend in a vertical direction and whose respective one ends are connected to each other in a horizontal direction via conductive connecting sections having contact regions; a dielectric film, which is formed in a region between the contact regions and the capacitor lower electrodes over the conductive connecting sections and formed over the capacitor lower electrodes; capacitor upper electrodes, which are formed over the dielectric film over the capacitor lower electrode and formed at least in a line in the vertical direction; and upper conductive patterns, which are formed in the same layer as the capacitor upper electrodes over the dielectric film over the conductive connecting sections, and at an interval from capacitor upper electrode closest to the conductive connecting sections.

According to another aspect of the present invention, there is provided a manufacturing method of a semiconductor device comprising the steps of: forming the first insulating film over the semiconductor substrate; forming a first conductive film, a dielectric film, and a second conductive film over the first insulating film in order; coating resist over the second conductive film; patterning the coated resist to form first resist patterns having the planar shape of the capacitor upper electrode in a plate line region at least in a line at an interval in the vertical direction; patterning the resist to form second resist patterns, which are adjacent to the closest first resist pattern at an interval in the vertical direction in a connection region connected to the edge of the plate line region and have openings in the contact region of the connection region; etching the second conductive film by using the first and second resist patterns as masks to form the capacitor upper electrodes, which consist of the second conductive film, under the first resist patterns and to simultaneously form upper conductive patterns which consist of the second conductive film and to which the contact region is to be open, under the second resist patterns; removing the first and second resist patterns; patterning the dielectric film to leave the dielectric film at least under the capacitor upper electrodes and the upper conductive patterns; patterning the first conductive film to form plate lines that become capacitor lower electrodes in the entire plate line region; and patterning the first conductive film to form conductive connecting sections, which are wider than the plate lines in a horizontal direction and connected to one ends of the plate lines and exposing the contact regions from the upper conductive patterns and the dielectric film.

According to the present invention, the device has: the capacitor upper electrodes formed over the plate lines, which become the capacitor lower electrodes, via the dielectric film; the conductive connecting sections, which are connected to one ends of the plate lines and have the contact region; and the upper conductive patterns that are formed over the dielectric film over the conductive connecting section, in a region between the contact region and the plate line edge and on the same layer as the capacitor upper electrodes.

Therefore, since the upper conductive patterns are formed close to one end of the capacitor upper electrode that is formed closest to one end of the plate line, the capacitor upper electrode does not become substantially the outermost conductive pattern over the plate line and its periphery. Consequently, film thickness distribution becomes substantially the same in one end and the other end of the capacitor upper electrode closest to one end of the plate line, and the film thickness does not change gently on both end portions. It results in stabilization of the electrical characteristics of a capacitor having the capacitor upper electrode.

When etching is conducted to the conductive film by using masks to simultaneously form a plurality of capacitor upper electrodes and the upper conductive patterns, excessive supply of etching gas to the capacitor upper electrode, which is formed closest to one end of the plate line region, is suppressed. In addition, the second resist patterns used as a mask for forming the upper conducting patterns are present near the first resist patterns used as a mask for forming the capacitor upper electrodes, so that proximity effect of exposure is obtained during exposure to form the first resist patterns. Thus, it leads to stabilization of the exposure to an area of the first resist patterns, which is close to the second resist patterns.

As described above, it is possible to constitute the capacitor upper electrode closest to the one end of the plate line as an actually-operating capacitor, and to improve the degree of integration of the actually-operating capacitors formed in the plate line region.

Further, the upper conductive patterns adjacent to the capacitor upper electrodes are formed over the conductive connecting sections for connecting electrically the wiring to the plate lines, and moreover, the upper conductive patterns are formed over a region other than wiring contact regions of the conductive connecting sections. Therefore, the upper conductive patterns do not affect the improvement of the degree of integration of capacitors on the plate lines.

Meanwhile, in forming the insulating film on the capacitors in the memory cell region, the upper conductive patterns prevent the supply of reducing gas or the like used for growing the insulating film to the sides of the capacitors. Thus, it can suppress the deterioration of the capacitor characteristics. Particularly, its suppression is more effective when the width of the upper conductive patterns is formed wider than the width of the capacitor upper electrodes.

Furthermore, in a process where etching is performed to the conductive film constituting the capacitor upper electrodes, the capacitor dielectric film, or the insulating film covering the capacitors to expose the contact regions of the conductive connecting sections, the upper conductive patterns prevent deteriorated gas from infiltrating to the capacitor upper electrodes through the contact regions. This prevents the deterioration of the actually-operating capacitor.

Still further, since the wiring connected to the contact regions of the conductive connecting sections that connect two or more plate lines is arranged so as to pass over the conductive connecting section, it does not affect the connection of wiring to the capacitor upper electrodes.

BRIEF DESCRIPTION OF THE DRAWINGS

FIGS. 5A to 5G are plan views showing the forming process of the semiconductor device according to the embodiment of the present invention;

FIG. 16 is a plan view showing another example of the memory cell region of the semiconductor device according to the embodiment of the present invention; and FIG. 17 is a plan view showing the memory cell region having dummy capacitors in the semiconductor device according to the embodiment of the present invention.

DESCRIPTION OF THE PREFERRED EMBODIMENT

Figure 5B:
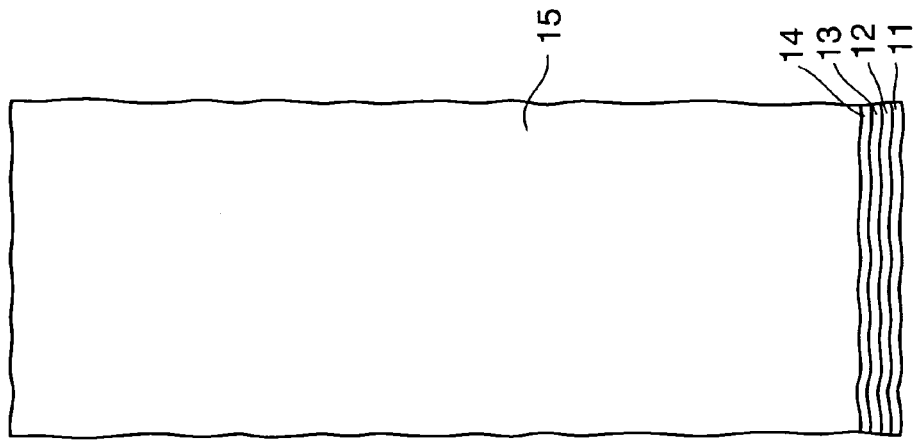
Figure 5A:
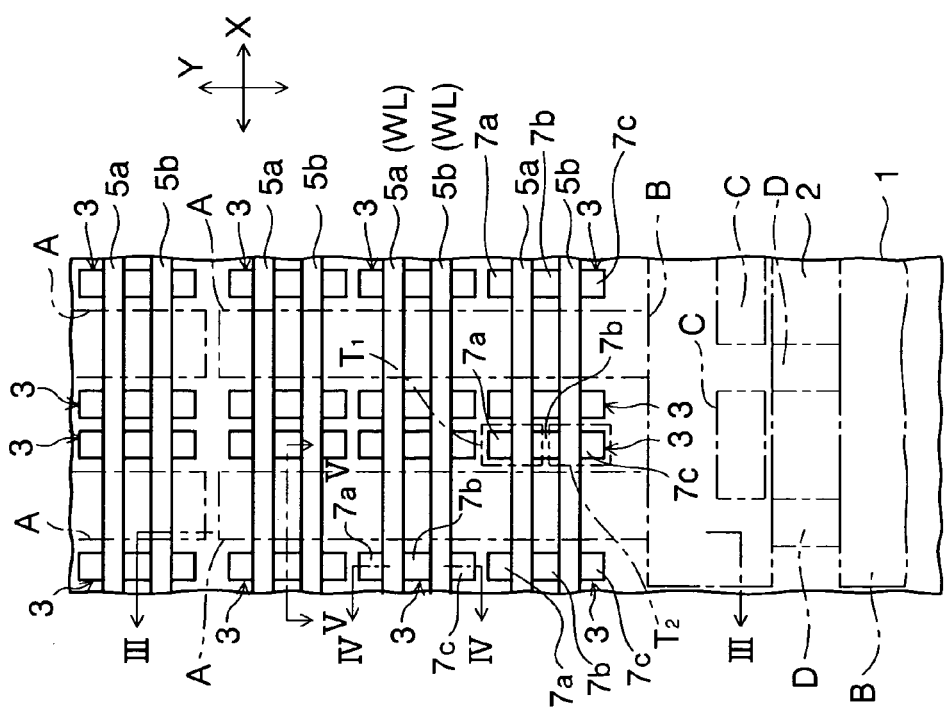
Figure 6A:
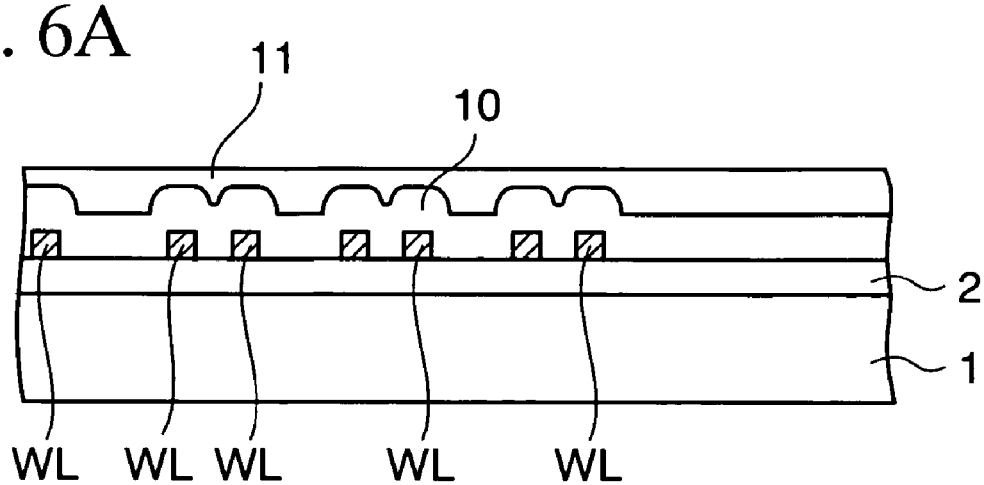
FIGS. 6A to 6G are sectional views showing the forming process of the semiconductor device according to the embodiment of the present invention.
Figure 6B:
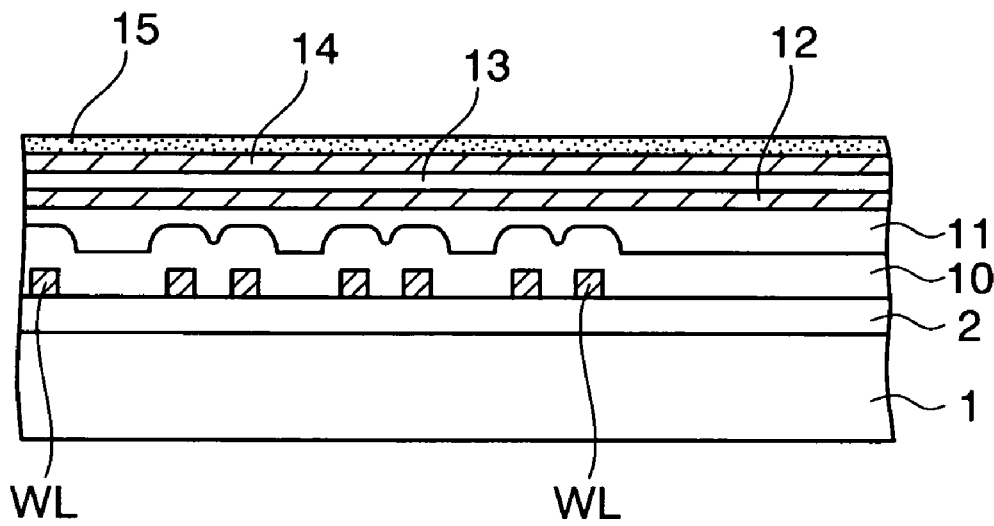
Figure 6C:
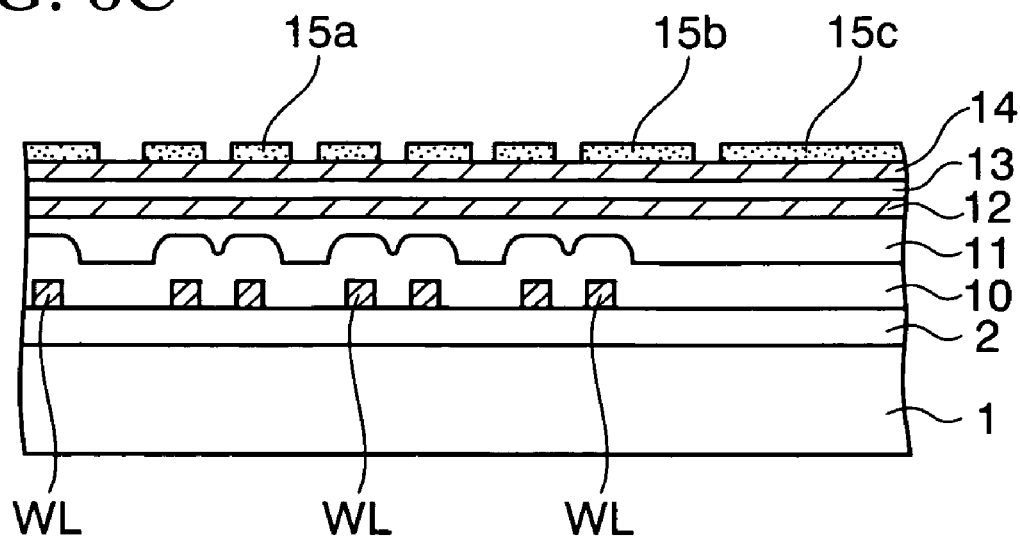
Figure 6D:
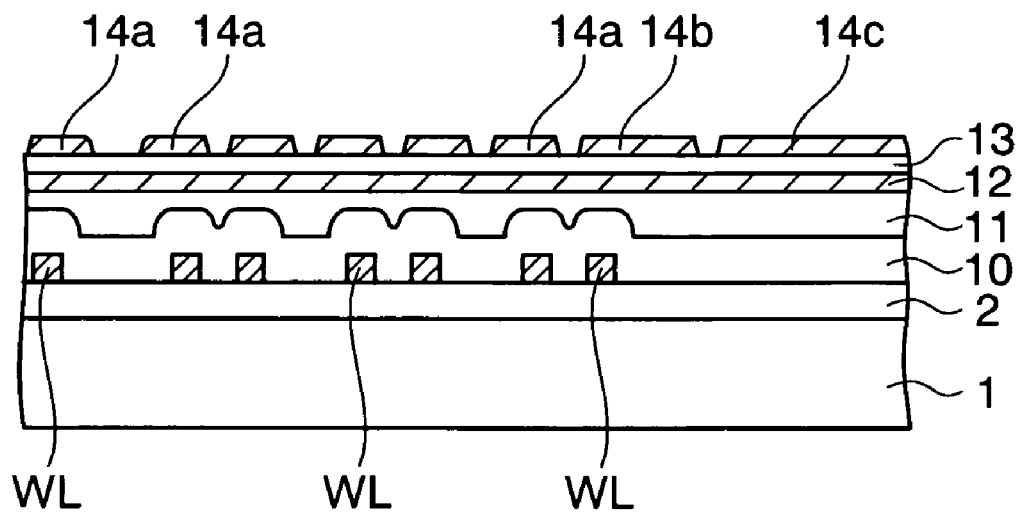
Figure 6E:
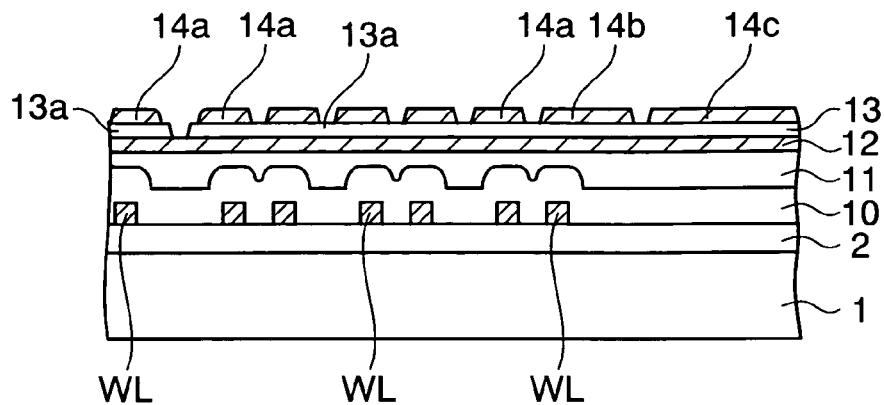
Figure 6F:
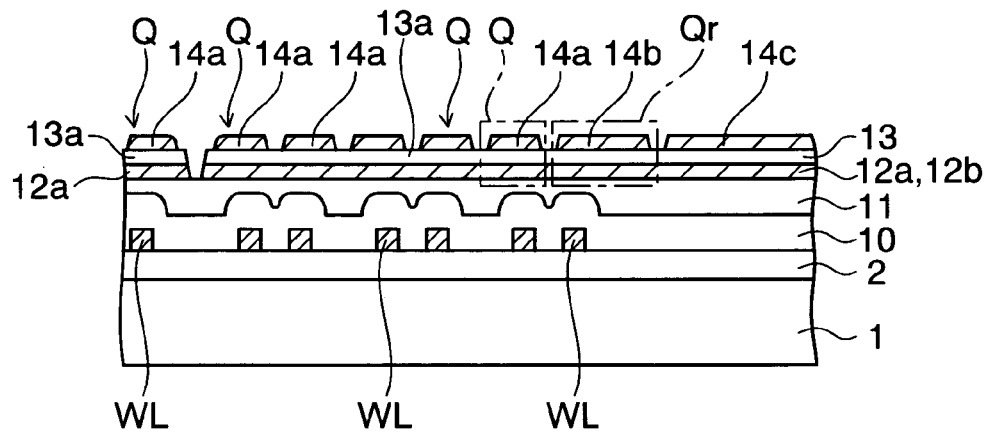
Figure 6G:
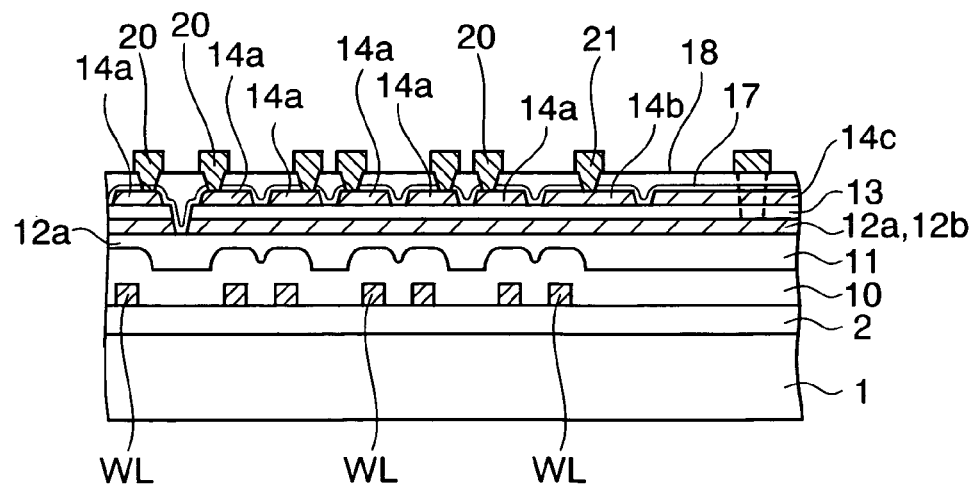
Figure 7:
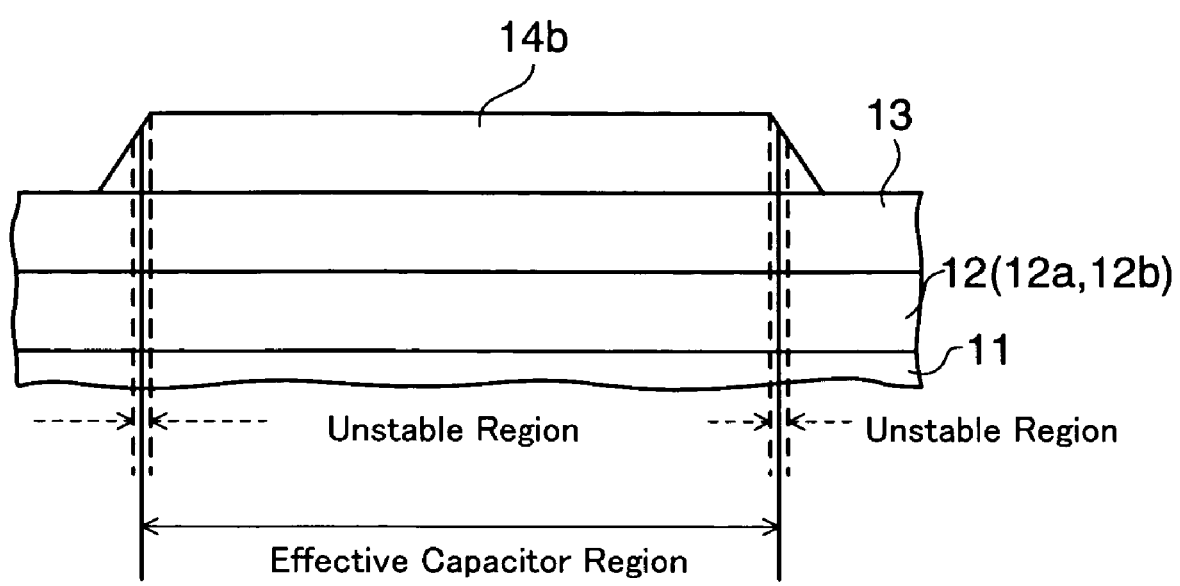
FIG. 7 is a sectional view showing the capacitor of the semiconductor device according to the embodiment of the present invention.
Figure 8A:
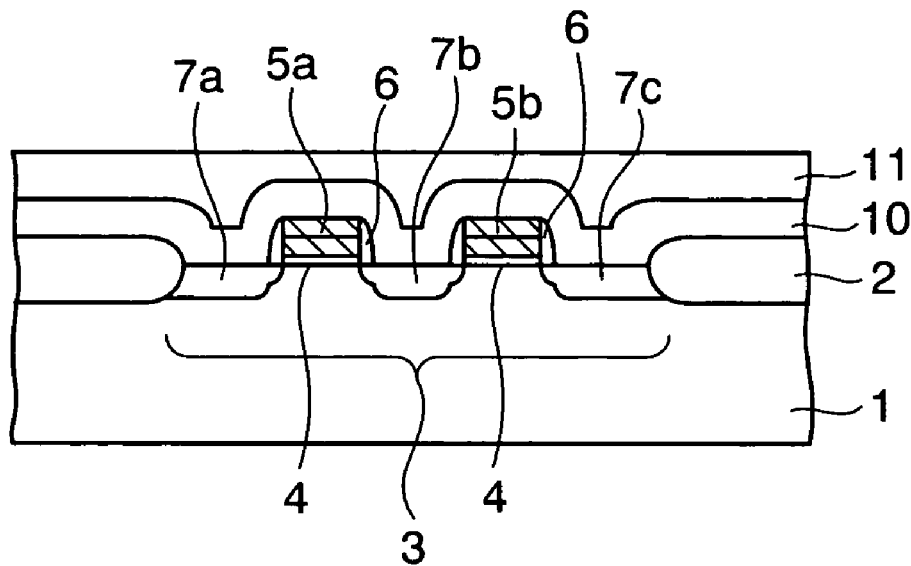
FIGS. 8A and 8B are second sectional views showing the forming process of the semiconductor device according to the embodiment of the present invention.
Figure 8B:
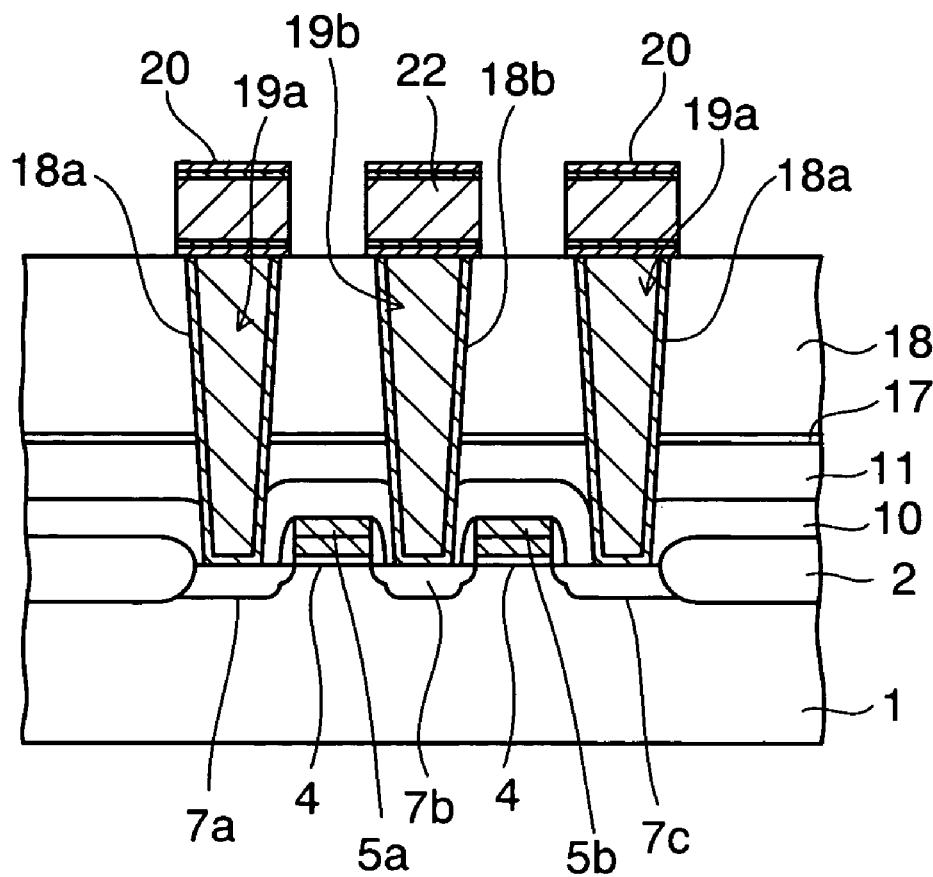
Figure 9A:
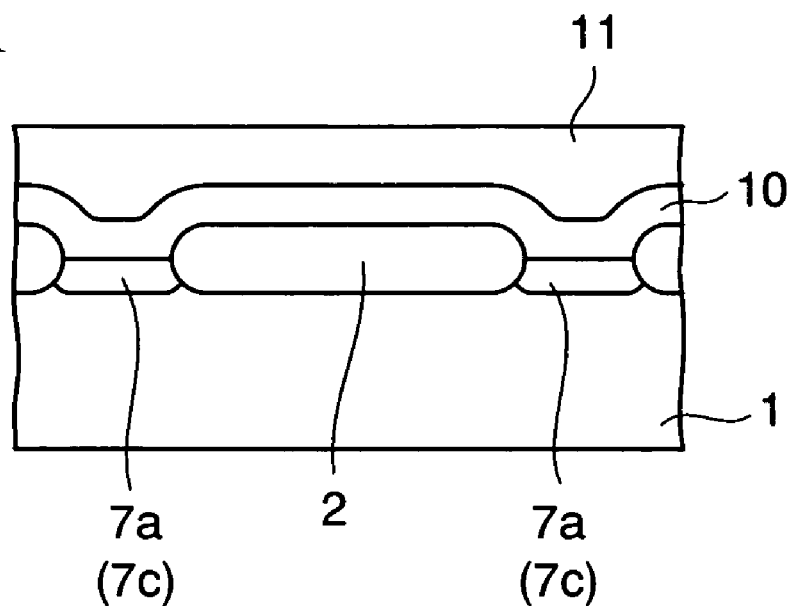
FIGS. 9A and 9B are third sectional views showing the forming process of the semiconductor device according to the embodiment of the present invention.
Figure 9B:
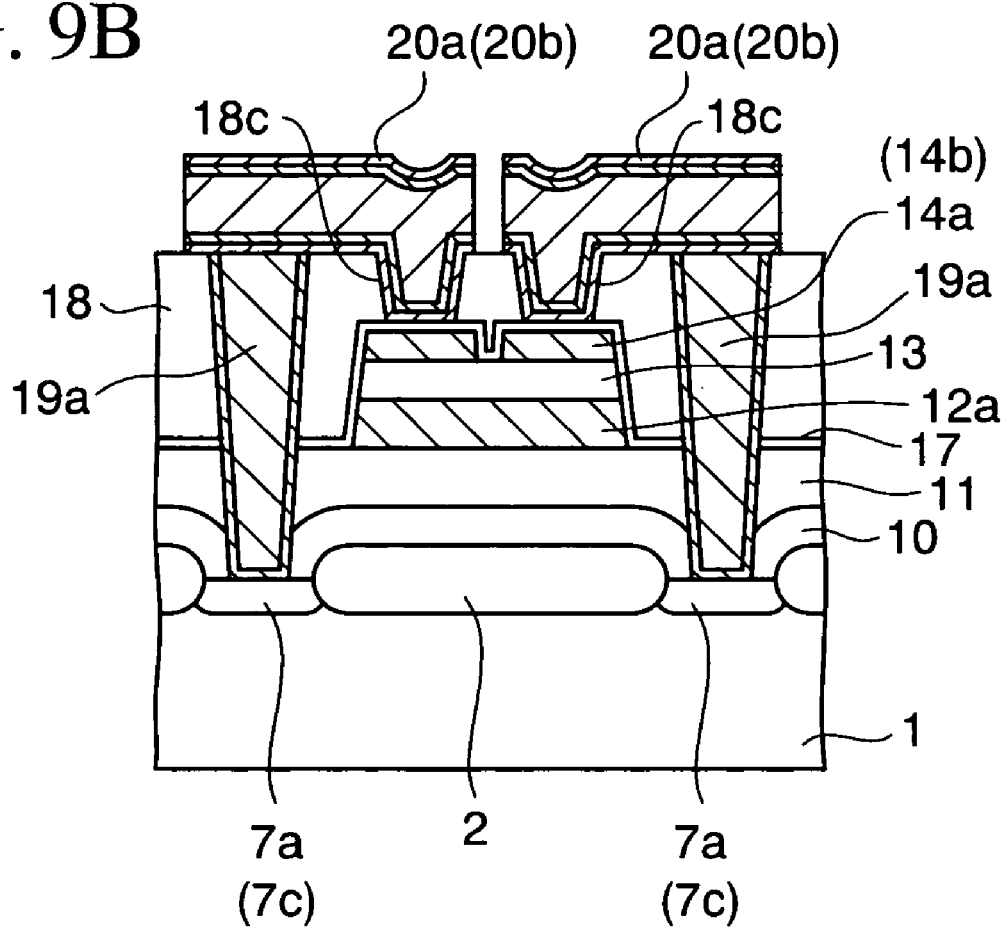

FIGS. 5A to 5G are the plan views showing the forming process of the semiconductor device according to the embodiment of the present invention, FIGS. 6A to 6G are the first sectional views showing the forming process of a memory cell of 1T1C type in the semiconductor device according to the embodiment of the present invention, FIG. 7 is the sectional view showing an upper electrode of the reference capacitor of the semiconductor device according to the embodiment of the present invention, FIGS. 8A and 8B are the second sectional view showing the forming process of the semiconductor device according to the embodiment of the present invention, and FIGS. 9A and 9B are the third sectional views showing the forming process of the semiconductor device according to the embodiment of the present invention.

Note that FIGS. 6A to 6G are the sectional views of the process viewing from III—III line of FIG. 5A, FIG. 8A is the sectional view of the process where the area viewed from IV—IV line is enlarged, and FIG. 9A is the sectional view of the process where the area viewed from V—V line is enlarged.

Next, description will be made for the process until the structure shown in FIGS. 5A, 6A, 8A and 9A is formed.

First, an element isolation insulating film 2 is formed on the surface of a p-type silicon (semiconductor) substrate 1 by the LOCOS (Local Oxidation of Silicon) method. The element isolation insulating film 2 is formed in a region surrounding a plurality of active regions (transistor-forming regions) 3 of the silicon substrate 1.

The planar shape of the active regions 3 are approximate rectangular shapes, and their long side direction is arranged so as to be in a direction orthogonal to the word lines (described later). Further, a plurality of the active regions 3 are arranged on both sides of a plurality of plate line regions A in the longitudinal direction of the plate line regions A, that is, the Y-direction in the drawing (vertical direction) at an interval. Note that the interval of approximately 2 to 3 μm is maintained between the plate line regions A that sandwich the area where a plurality of the active regions are formed.

Subsequently, thermal oxidation is performed to the surface of the silicon substrate 1 to form a silicon oxide film that becomes a gate insulating film 4 shown in FIG. 8A on the active regions 3.

Next, an amorphous or polycrystalline silicon film is formed on the element isolation insulating film 2 and the gate insulating film 4, and a tungsten silicide film is further formed on the silicon film. Then, the silicon film and the tungsten silicide film are patterned by the photolithography method to form the gate electrodes 5a, 5b over the active region 3. The two gate electrodes 5a, 5b are formed substantially parallelly with each other over each active region 3 at an interval, and the gate electrodes 5a, 5b extend on the element isolation insulating film 2 to be the word lines WL. The word lines WL are formed extending in a direction that intersects with the longitudinal direction of the plate line regions A.

Next, an n-type impurity is ion-implanted into the active region 3 on both sides of the gate electrodes 5a, 5b to form first to third n-type impurity diffusion regions 7a, 7b, 7c that become source/drain of n-type MOS transistors $T_1$, $T_2$. The second impurity diffusion region 7b located in the center of the active region 3 is to be connected electrically to the bit line, and the first and third impurity diffusion regions 7a, 7c located on both end sides of the active region 3 are to be connected electrically to the upper electrode (described later) of the capacitor.

Then, an insulating film is formed on the silicon substrate 1, the element isolation insulating film 2 and the gate electrodes 5a, 5b. The insulating film is etched back to leave it as a sidewall insulating film 6 on the sides of the gate electrodes 5a to 5c shown in FIG. 8A. Silicon oxide ($SiO_2$) is formed as the insulating film by the CVD method, for example.

Subsequently, the gate electrodes 5a, 5b and the sidewall insulating film 6 on the active region 3 are used as masks, the n-type impurity is ion-implanted into the active region 3 again, and thus the n-type impurity diffusion regions 7a to 7c are transformed into an LDD (Lightly Doped Drain) structure.

This configuration leads to a formation of the first n-type MOS transistor $T_1$ having the first and second n-type impurity diffusion regions 7a and 7b and the gate electrode 5a, and the second n-type MOS transistor $T_2$ having the second and third n-type impurity diffusion regions 7b and 7c and the gate electrode 5b. The MOS transistors $T_1$, $T_2$ serve as switching active elements that electrically connect or disconnect a capacitor (described later) and the bit line.

Then, an insulative cover film 10 covering the n-type MOS transistors $T_1$, $T_2$ is formed on the silicon substrate 1 by the plasma CVD method. A silicon oxynitride (SiON) film is formed as the cover film 10, for example.

Next, the silicon oxide film is formed on the cover film 10 in the thickness of approximately 1.0 μm by the plasma CVD method using TEOS (tetra ethyl ortho silicate), and the silicon oxide film is used as a first interlayer insulating film 11.

Subsequently, as densifying processing of the first interlayer insulating film 11, thermal processing is performed to the first interlayer insulating film 11 at the temperature of approximately 700° C. for 30 minutes in nitrogen atmosphere under normal pressure. Then, the top surface of the first interlayer insulating film 11 is planarized by the CMP (Chemical Mechanical Polishing) method.

Note that the insulating film formed over the element isolation insulating film 2 is omitted from illustration in FIG. 5A.

Next, description will be made for the process until the structure shown in FIGS. 5B and 6B is formed.

First, a titanium (Ti) film and a platinum (Pt) film are formed as a first conductive film 12 in order on the first interlayer insulating film 11. The Ti film and the Pt film are formed by the DC sputtering method, and the thickness of the Ti film and the Pt film is set to approximately 10 to 30 nm and 100 to 300 nm, respectively. Note that a conductive film containing at least one of noble metal and noble metal oxide (such as iridium, ruthenium, ruthenium oxide and iridium oxide) may be formed as the first conductive film 12.

Subsequently, a lead zirconate titanate (PZT: $Pb(Zr_{1-x}Ti_x)O_3$) film having the thickness of 100 to 300 nm as a ferroelectric layer 13 is formed on the first conductive film 12 by the RF sputtering method. There exist the MOD (metal organic deposition) method, the MOCVD (metal organic CVD) method, the Sol-gel method or the like as the forming method of the ferroelectric layer 13. Further, as the material of the ferroelectric layer 13 other than PZT, another PZT series material such as PLCSZT and PLZT, Bi layer structure compound such as $SrBi_2Ta_2O_9$ (SBT, Y1) and $SrBi_2(Ta,Nb)_2O_9$ (SBTN, YZ), or another metal oxide ferroelectric may be adopted.

Further, as a crystallization processing of the PZT film that constitutes the ferroelectric film 13, the RTA (Rapid Thermal Annealing) is performed in oxygen atmosphere under the conditions of the temperature of 650° to 850° C. for 30 to 120 seconds. For example, annealing is conducted at the temperature of 700° C. for 60 seconds.

Then, an iridium oxide ($IrO_2$) film as a second conductive film 14 is formed on the ferroelectric film 13 at the thickness of 100 to 300 nm by the sputtering method. Note that platinum or strontium ruthenium oxide (SRO) may be used as the second conductive film 14.

Subsequently, resist 15 is coated on the second conductive film 14.

Next, as shown in FIGS. 5C and 6C, exposure and development are performed to the resist 15 to form resist patterns for first upper electrode 15a, resist patterns for second upper electrode 15b, and dummy resist patterns 15c.

The resist patterns 15a for first upper electrode have the planar shape of the upper electrode of the memory cell capacitor for storing information, and they are formed in two lines in the Y-direction and at an interval from each other per-a plate line region A, and plurality sets of the two lines are formed corresponding to a plurality of plate line regions A.

Furthermore, the resist patterns 15b for second upper electrode has the planar shape of the upper electrode of the reference capacitor, and they are formed in each plate line region A and in a closer region to one end of each plate line region A. And they are formed at the rearmost position of each row of resist patterns 15a for first upper electrode and at an interval from the patterns 15a.

The dummy resist patterns 15c, in a connection region B connecting one ends of a plurality of the plate line regions A shown in FIG. 5A, are formed in an closer area to the resist patterns 15b for second upper electrode in the Y-direction. The connection region (coupling region) B extends in a striped shape in the X-direction (horizontal direction) that intersects with the longitudinal direction of the plate line regions A. The dummy resist pattern 15c expands to a bridge region D that connects parts of two connection regions B adjacent to each other in the Y-direction. The length of approximately 5 μm is taken for the two connection regions B connected in the Y-direction and the bridge region D therebetween.

The interval of approximately 0.1 to 0.4 μm is taken between adjacent patterns composed of the resist patterns 15a for first upper electrode, the resist patterns for second upper electrode 15b, and the dummy resist patterns 15c. Specifically, the interval between the resist patterns 15a, 15b for first and second upper electrodes is substantially the same as the interval between the resist patterns 15b for second upper electrode and the dummy resist patterns 15c.

Further, contact regions C surrounded by the dummy resist patterns 15c are present in the connection region B and in a region which is farther from the resist patterns 15b for second upper electrode in the Y-direction.

Next, the second conductive film 14 is etched while masks are composed of the resist patterns 15a for first upper electrode, the resist patterns 15b for second upper electrode, and the dummy resist patterns 15c.

The etching is performed by an inductively coupled plasma etching equipment, for example. It is based on the etching conditions such that chlorine ($Cl_2$) gas and argon (Ar) gas are introduced into etching atmosphere at 20 ml/min. and 30 ml/min. respectively, the vacuum level in the etching atmosphere is set to 0.7 Pa, the temperature of a wafer stage on which the silicon substrate 1 is mounted in the etching atmosphere is set to 25° C., and a source power and a bias power are set to 1400 W and 800 W respectively. Note that the source power is the 13.56 MHz high-frequency power from a power source, which is applied to the antenna coil of the inductively coupled plasma etching equipment. Further, the bias power is the 400 KHz high-frequency power from the power source, which is applied to the wafer stage.

Accordingly, the patterned second conductive film 14 is left as first upper electrodes 14a under the resist pattern 15a for first upper electrodes, as second upper electrodes 14b under the resist patterns 15b for second upper electrodes, and as dummy conductive patterns 14c under the dummy resist patterns 15c. The first upper electrodes 14a, the second upper electrodes 14b, and the dummy conductive patterns 14c are apart from each other.

The first upper electrode 14a has an area with the width of approximately 1.2 μm in the X-direction and the length of approximately 1.8 μm in the Y-direction. Further, the second upper electrode 14b has an area with the width of approximately 1.2 μm in the X-direction and the length of approximately 2.7 μm in the Y-direction.

The dummy conductive pattern 14c has an opening 14d in the contact regions C of two connection regions B, and has a bridge section 14e in the bridge region D between the connection regions B. Note that FIGS. 5D and 6D show the state after a removal of the resist patterns 15a for first upper electrode, the resist patterns 15b for second upper electrode, and the dummy resist patterns 15c.

The both end portions in the Y-direction of the second upper electrode 14b, which is formed under the above-described conditions, are in a substantially symmetrical shape viewed from the center as shown in the sectional view of FIG. 7. In other words, the film thickness distribution on one end portion is substantially the same as that of the other end portion, and thus the film thickness of either one end portion does not change gently.

Next, as shown in FIGS. 5E and 6E, the ferroelectric film 13 is etched by using a resist pattern (not shown), and integrally left in the plate line regions A, the connection regions B and the bridge regions D. Consequently, the ferroelectric film 13 becomes a continuous pattern under each of the first upper electrodes 14a, the second upper electrodes 14b and the dummy conductive patterns 14c and between those respective regions. At the same time, the ferroelectric film 13 is etched in a region of the openings 14d of the dummy conductive pattern 14c, and it results in a formation of openings 13d where a part of the first conductive film 12 is exposed in the contact regions C.

Note that the etching conditions of the ferroelectric film 13 is the same as the etching conditions for the second conductive film 14, for example.

Subsequently, as shown in FIGS. 5F and 6F, the first conductive film 12 is etched by using the resist pattern (not shown), and the first conductive film 12 is continuously left in the plate line regions A, the connection regions B and the bridge regions D.

As a result, the first conductive film 12 left in each of the plate line regions A becomes a plate line 12a whose width in the X-direction is approximately 2.6 μm. It functions as the lower electrode of capacitor. Further, the first conductive film 12 left in the connection regions B becomes a conductive plate line connecting section 12b that connects one ends of a plurality of the plate lines 12a in the X-direction. The plate line connecting sections 12b are formed around the contact regions exposed from the openings 13d of the ferroelectric film 13, and the bridge regions D have bridge sections 12d therein. Note that the etching conditions of the first conductive film 12 is set to the same conditions as the etching conditions for the second conductive film 14, for example.

A capacitor Q for one memory cell is constituted by one of the first upper electrodes 14a formed as described above, and the ferroelectric film 13 and plate line 12a thereunder. In other words, the capacitors Q for memory cell having the same number of the first upper electrodes 14a are present in the plate line regions A.

Furthermore, a reference capacitor $Q_r$ is constituted by the closest second upper electrode 14b to one end of the plate line 12a, and the ferroelectric film 13 and the plate line 12a thereunder.

Next, description will be made for the process until the structure shown in FIGS. 5G, 6G, 8B and 9B is formed.

Alumina, for example, as a capacitor protection insulating film 17 is formed on the plate lines 12a, plate line connecting sections 12b, the ferroelectric film 13, the upper electrodes 14a, 14b, and the first interlayer insulating film 11, in the thickness of approximately 20 nm. Note that PZT, a silicon nitride film, a silicon nitride-oxide film, or another reduction-preventing insulating film may be formed instead of alumina.

Furthermore, a silicon oxide film as a second interlayer insulating film 18 is formed on the capacitor protection insulating film 17 in the thickness of approximately 1 μm. The silicon oxide film is formed by the CVD method by using a gas mixture of TEOS, helium and oxygen.

Subsequently, the top surface of the second interlayer insulating film 18 is planarized by the CMP method. In this example, the residual film thickness of the second interlayer insulating film 18 after the planarization is set to approximately 300 nm together with the film thickness of the capacitor protection insulating film 17 on the capacitors Q.

Then, patterning is performed for the second interlayer insulating film 18, the capacitor protection insulating film 17, the first interlayer insulating film 11, and the cover film 10 by using lithography and etching. Thus, first contact holes 18a are formed on the first and third n-type impurity diffusion regions 7a, 7c and second contact holes 18b are simultaneously formed on the second n-type impurity diffusion regions.

Moreover, a titanium (Ti) film having the thickness of 20 nm and a titanium nitride (TiN) film having the thickness of 50 nm are formed in order on the second interlayer insulating film 18 and inside the first contact holes 18a and the second contact holes 18b by the sputtering method, and further, a tungsten (W) film is formed on the TiN film by the CVD method. The thickness of the W film is taken so as to completely fill the inside of the capacitor contact holes 18a and the inside of the bit line contact holes 18b with the film.

Then, the Ti film, TiN film and W film are polished by the CMP method to remove them from the top surface of the second interlayer insulating film 18. Consequently, the Ti film, TiN film and W film left in the first contact holes 18a are used as a first conductive plug 19a connected electrically to the capacitors Q or the reference capacitors $Q_r$, and the Ti film, TiN film and W film left in the second contact holes 18b are used as a second conductive plug 19b connected electrically to the bit lines.

Subsequently, an SiON film as an oxidation-preventing film (not shown) is formed on the second interlayer insulating film 18 and the first and second conductive plugs 19a, 19b. Then, patterning is performed for the oxidation-preventing film, the second interlayer insulating film 18 and the capacitor protection insulating film 17. It results in a formation of respective holes 18c, 18d for contacting upper electrode on the first upper electrodes 14a and the second upper electrodes 14b. At the same time, holes 18e for leading out lower electrode, which pass through the openings 13d, 14d of the ferroelectric film 13 and the dummy conductive pattern 14c, are formed in the second interlayer insulating film 18, and holes 18f for leading out dummy pattern are formed in the second interlayer insulating film 18 on the dummy conductive pattern 14c.

Then, annealing is performed for the capacitors Q, $Q_r$ that suffered damage due to the formation of each hole 18c, 18d, 18e, 18f. It results in recovery of the film quality of the capacitors Q, $Q_r$. The annealing is conducted in oxygen atmosphere at the substrate temperature of 550° C. for 60 minutes, for example.

After removing the oxidation-preventing film by etching back, a metal film is formed on the second interlayer insulating film 18, on the first and second conductive plugs 19a, 19b, and inside the holes 18c, 18d, 18e, 18f, and then, the metal film is patterned by the photo-lithography method. As the metal film, a multi-layer structure conductive film is formed by the sputtering method. The multi-layer structure conductive film is composed of a TiN film having a film thickness of 150 nm, a Ti film having the film thickness of 5 nm, an Al—Cu film having the film thickness of 500 nm, a TiN film having the film thickness of 50 nm, and a Ti film having the film thickness of 20 nm, which are formed in this order.

Then, patterning is performed for the metal film to form first wiring 20 by which the first upper electrode 14a and the first conductive plug 19a in the horizontal direction are connected electrically one to one through the hole 18c, and second wiring 21 by which the second upper electrode 14b and another first conductive plug 19a in the horizontal direction are connected electrically one to one through the hole 18d. Further, patterning is performed for the metal film to form island-like conductive pads 22 on the second conductive plugs 19b.

Figure 10:
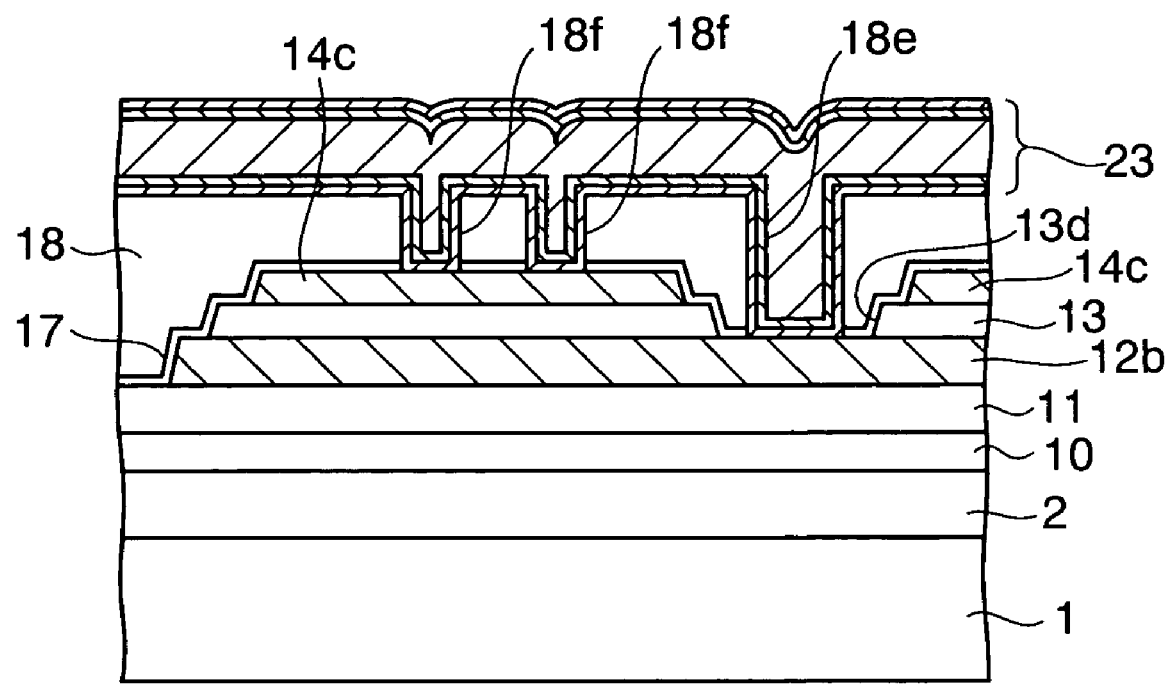
FIG. 10 is a sectional view showing the connection region of the semiconductor device according to the embodiment of the present invention.

Further, patterning is performed for the metal film to form a data wiring 23 extending in the X-direction over the plate line connecting sections 12b. The data wiring 23 has the width of approximately 0.8 μm in the Y-direction. And it is connected electrically to the plate line 12b and the dummy conductive pattern 12c through the hole 18e for leading out lower electrode and the hole 18f for leading out dummy pattern, as shown in FIG. 10, and connected to a peripheral circuit (not shown).

With this configuration, the first n-type impurity diffusion region 7a is connected electrically to the upper electrode 14a of the capacitor Q for memory cell via the wiring 20 and the first conductive plug 19a. Further, the close third n-type impurity diffusion region 7c to the end portion of the plate line region A is connected electrically to the upper electrode 14b of the reference capacitor $Q_r$ via the second wiring 21 and the first conductive plug 19a. The other third n-type impurity diffusion regions 7c are connected electrically to the upper electrodes 14a of the capacitors Q for another memory cell via the other wiring 20 and the other first conductive plugs 19a.

The plate line connecting sections 12b and the dummy conductive patterns 14c are connected electrically to each other via the data wiring 23 and are in the same potential. Therefore, the connection of the data wiring 23 prevents the occurrence of a capacitor caused by the plate line connecting section 12b, the dummy conductive pattern 14c, and the ferroelectric film 13 between them.

Subsequently, although not shown, it is followed by a formation of a third interlayer insulating film (not shown) covering the first wiring 20, second wiring 21, conductive pads 22, data wiring 23 and the like. Further, it is followed by forming bit lines connected to the conductive pads 22 and other wiring (not shown) on the third interlayer insulating film. Those description will be omitted.

In the above-described embodiment, the interval between the resist patterns 15b for second upper electrode and the dummy resist pattern 15c on the second conductive film 14 is set substantially the same as the interval between the resist patterns for first and second upper electrodes 15a, 15b. Specifically, pattern density around both ends of the resist pattern 15b for second upper electrode is high. Accordingly, an almost symmetrical shape is attained in the both end portions of the second upper electrode 14b, which was formed by conducting etching to the second conductive film 14 by using the resist pattern 15b for second upper electrode as a mask, and thus a film thickness distribution around the both end portions is substantially the same. In other words, the film thickness of either one end portion does not change gently.

Consequently, there is no need to form the dummy capacitor in the plate line regions A and thus the area of the plate line regions A can be narrow. It can lead to improvement of the degree of integration with regard to effective capacitors Q, $Q_r$ in the plate line regions A.

Further, a plurality of upper electrodes 14a, 14b are formed in the plate line regions A and the dummy conductive patterns 14c are simultaneously formed in the connection region B connecting to the plate line regions A. The connection region B is a region over which a plurality of data wiring 23 pass, a region that electrically connects the data wiring 23 and the plate lines 12a, and also a region where a capacitor is not formed. Therefore, even if the dummy conductive patterns 14c are formed in the connection region B, they do not affect the degree of integration of capacitors in the memory cell region.

Accordingly, it is preferable that the width (in the Y-direction) of the dummy conductive pattern 14c over the plate line connecting section 12b is same or less in contrast to the width (in the Y-direction) of the data wiring 23. Further, since the dummy conductive pattern 14c does not constitute a capacitor together with the ferroelectric film 13 and the plate line connecting section 12c under the pattern, an adverse effect is not caused to the operation of memory cell.

Figure 1A:
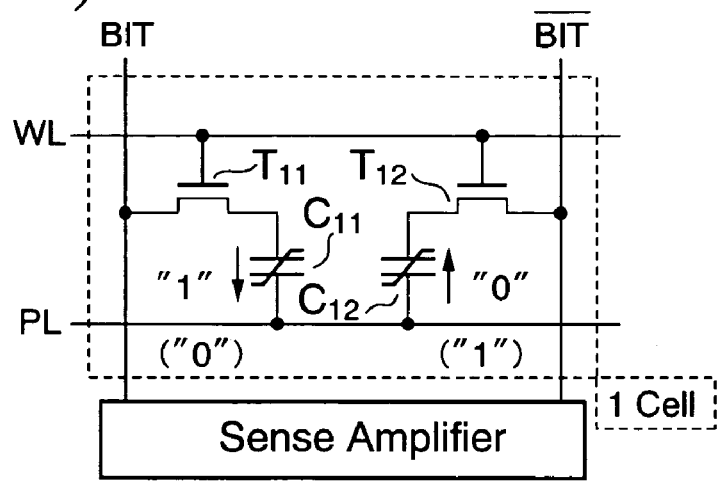
FIGS. 1A and 1B are circuit diagrams of the memory cell in the FeRAM.
Figure 1B:
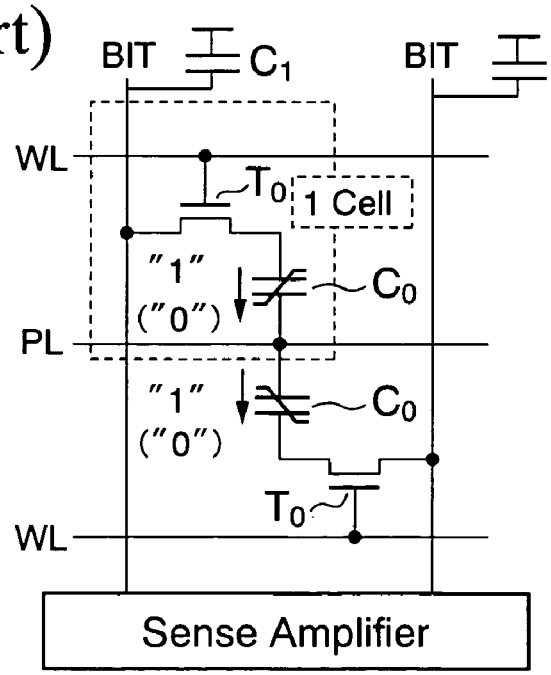
Figure 2:
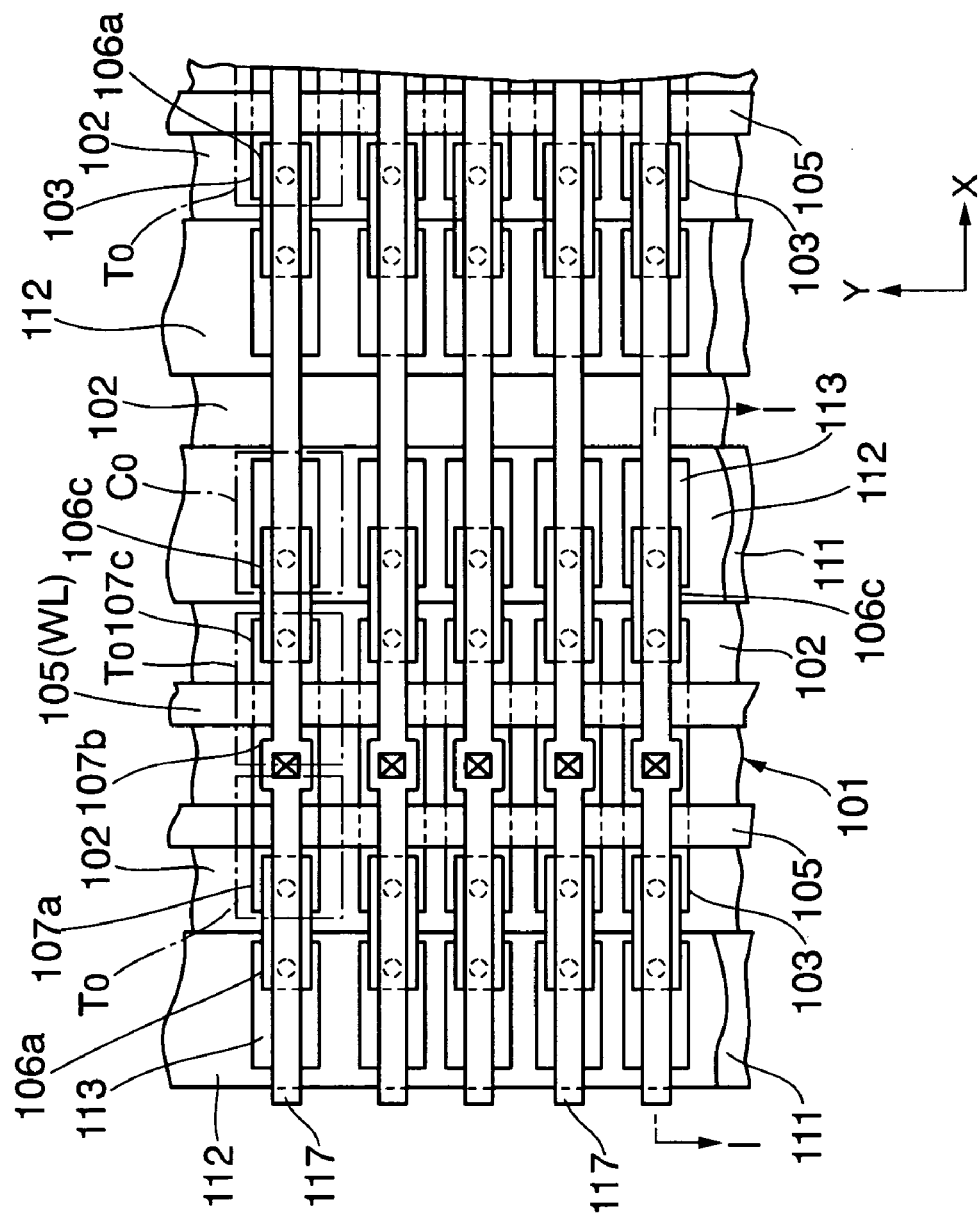
FIG. 2 is a plan view showing the memory cell in the conventional FeRAM.
Figure 3:
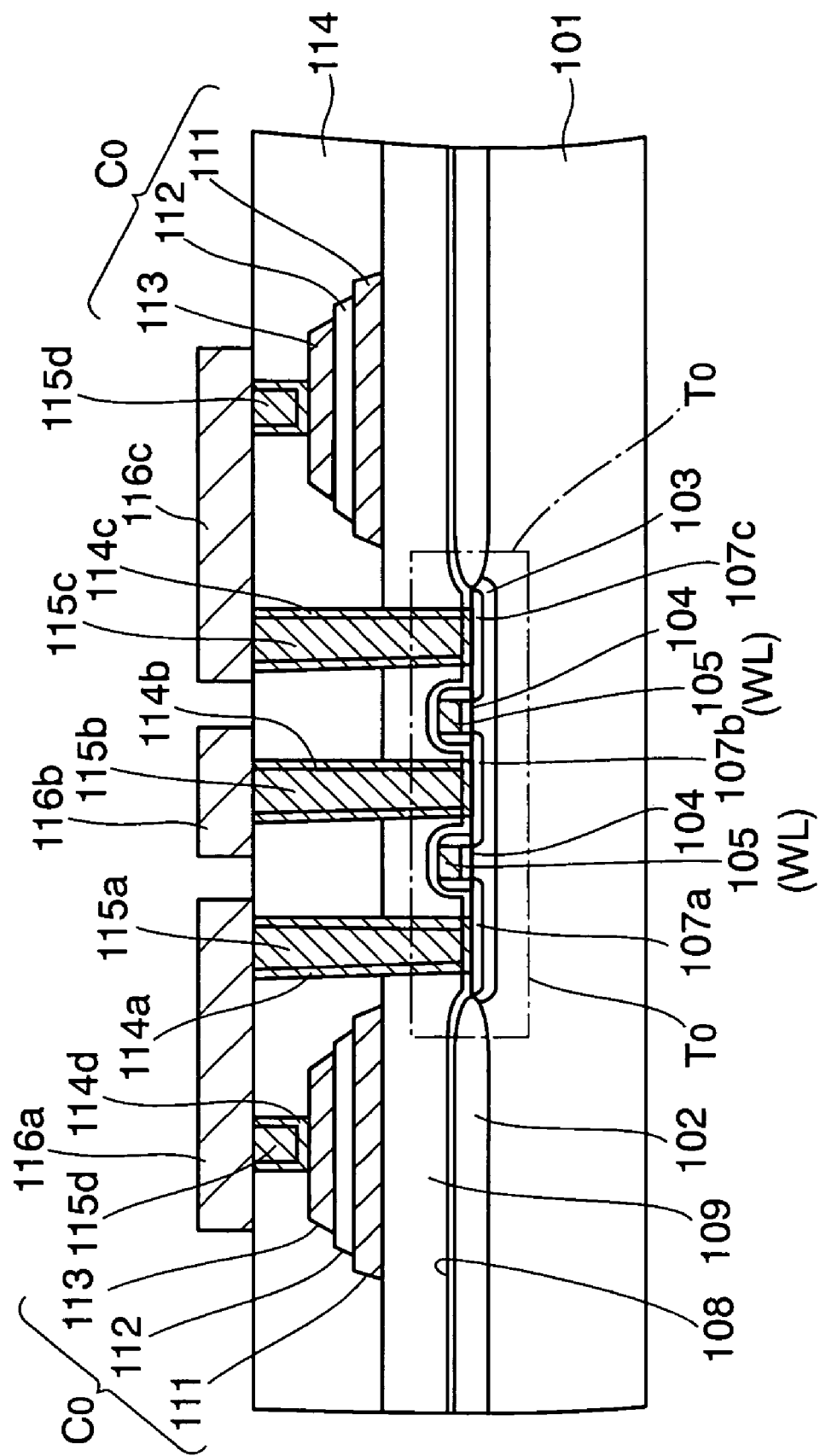
FIG. 3 is a sectional view showing the memory cell in the conventional FeRAM.
Figure 4A:
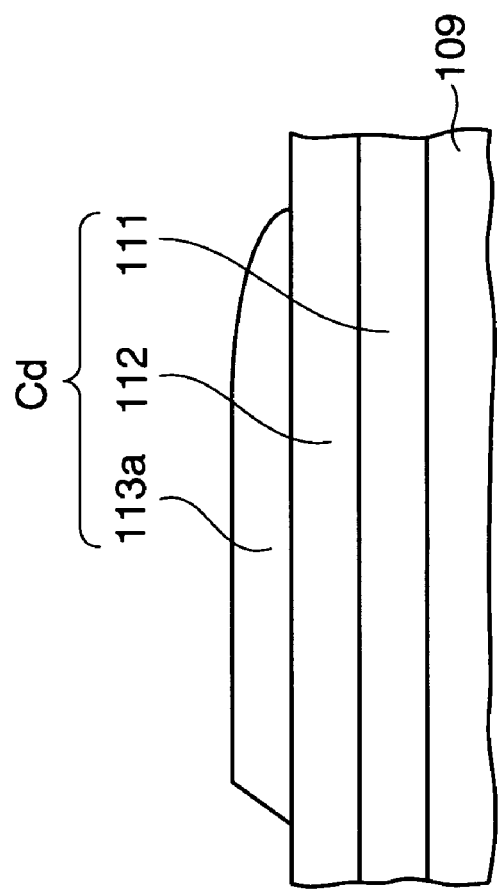
FIGS. 4A and 4B are a plan view and a partially sectional view showing the capacitor of the memory cell in the conventional FeRAM, respectively.
Figure 4B:
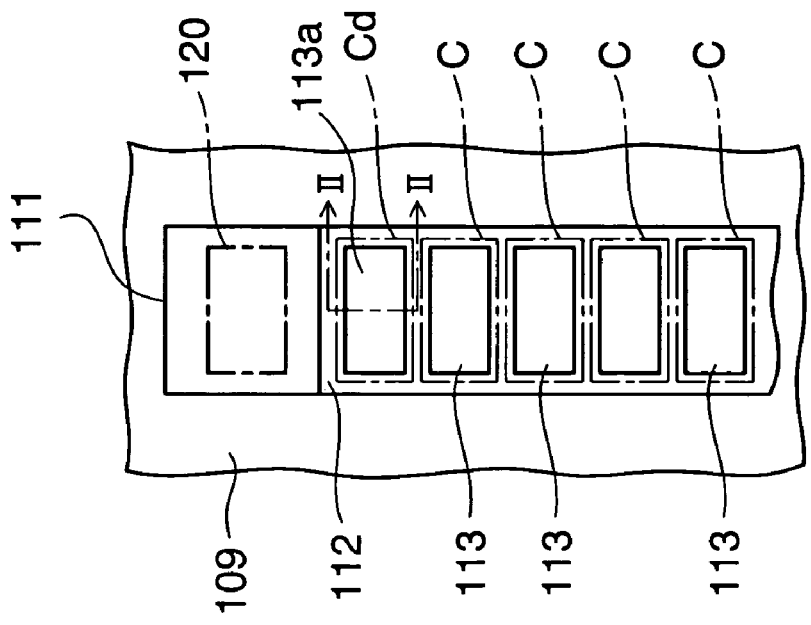
Figure 11A:
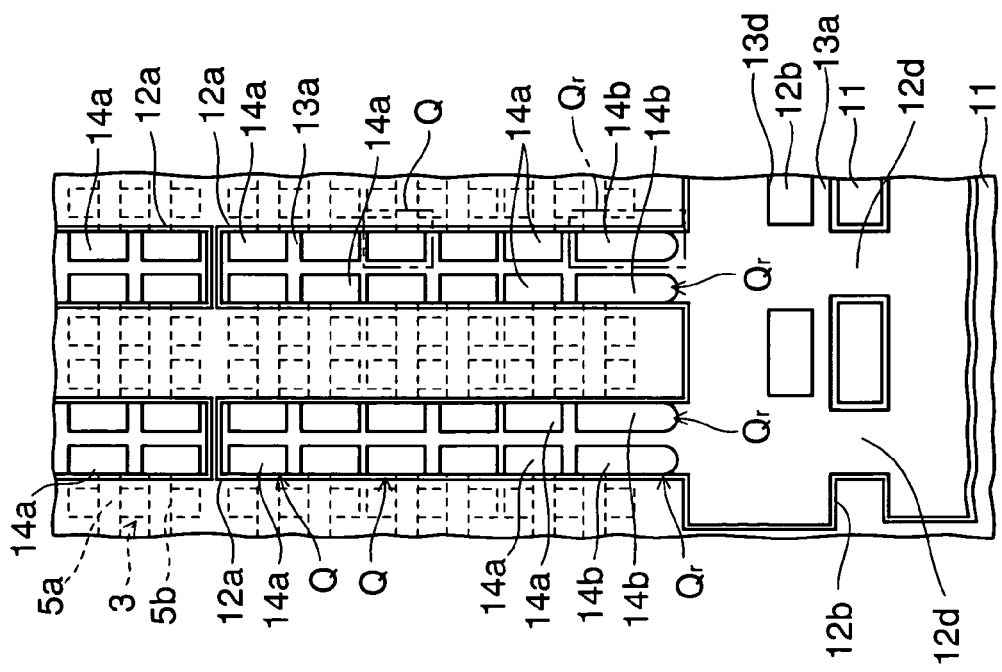
FIGS. 11A and 11B are a plan view and a partially sectional view showing the capacitors of a memory cell according to comparative example 1, respectively.
Figure 11B:
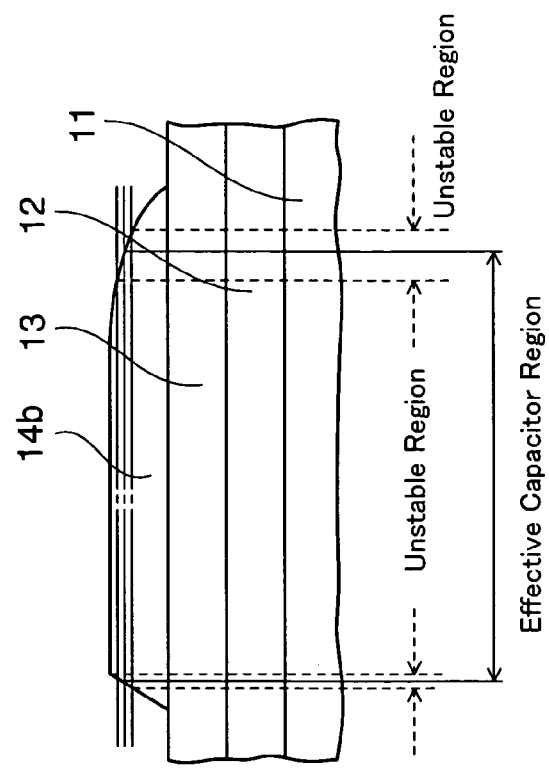

Meanwhile, if etching is conducted to the second conductive film 14 by using only resist patterns (15a, 15c) for first and second upper electrodes as masks without forming the dummy resist patterns 15c shown in FIG. 5C, and then patterning is conducted to the ferroelectric film 13 and the first conductive film 12, it leads to formation of a planer shape shown in FIG. 1A. In this case, a symmetry as shown in FIG. 11B is not obtained in the both end portions of the second upper electrodes 14b formed under the resist patterns 15b for second upper electrode. Thus, the film thickness of one end of the second upper electrode 14b gently changes in a wide range while the thickness of the other end sharply changes in a narrow range. It results in expansion of the unstable region of film thickness at one end of the second upper electrode 14b to make capacitor characteristics unstable.

The following reasons are considered as the cause that the pattern of the second upper electrode 14b is out of shape as shown in FIG. 11B.

The first reason is that there is no formed pattern of the same layer as the upper electrodes 14a, 14b on its surrounding wide region on one end of the plate line region A, and thus the connection region B falls into a non-dense state in the pattern density. With this, it is impossible to obtain the proximity effect at the time of exposure of the resist 15 on one end of the plate line region A, and thus it results in an increase of exposure to one end of the resist pattern 15b for second upper electrode. As a result, the resist pattern 15b for second upper electrode, which is formed by developing the resist 15, becomes out of shape locally.

The second reason is that, when there is no formed pattern of the same layer as the upper electrodes 14a, 14b on the wide region around the edge of the plate line region A, it results in an increase of the supply quantity of etching gas to one end of the second upper electrode 14b to corode the end portion of the second upper electrode 14b.

Due to such reasons, a part of the plate line region A near the coupling region B is disadvantageous for forming a normal pattern.

On the other hand, in the resist pattern 15b for second upper electrode and the second electrode 14b, which are formed in the state of arranging the dummy resist pattern 15c shown in FIG. 5C near the plate line region A, the both ends thereof become far from suffering damage. It leads to a sharp change of the film thickness, as shown in FIG. 7, on the both ends of the second upper electrode 14b, and thus the unstable region where the film thickness readily fluctuates is within the range of an allowable error.

Further, the dummy conductive patterns 14c that are formed for normalizing the patterns of the second upper electrodes 14b, are also formed along an area between the edges of a plurality of plate line regions A arranged in the X-direction and the width in the X-direction is wider than the resist patterns 15b for second upper electrode. Thus, the dummy conductive patterns 14c suppress the infiltration of the reducing gas, which is used in the process after the formation of the upper electrodes 14a, 14b, from another sides of the reference capacitors $Q_r$. With this, the deterioration of the electrical characteristics of reference capacitors $Q_r$ is suppressed.

Furthermore, when etching is conducted to a part of the second interlayer insulating film 18 to form the holes 18e for leading out lower electrode on the contact regions of the plate line connecting sections 12b, the dummy conductive patterns 14c prevent the etching gas from infiltrating in the reference capacitors $Q_r$. Thus, the reference capacitors $Q_r$ become far from impairing the electrical characteristics thereof by the deteriorated gas.

Incidentally, it has been made clear by experiment that the electrical characteristics of the reference capacitors $Q_r$ near the patterns were deteriorated by adopting a structure such that the holes 18f were not formed in the second interlayer insulating film 18, which corresponds to areas above the dummy conductive patterns 14c. In contrast, it has been made clear by experiment that the deterioration of the film quality of the ferroelectric film 13 not only under the dummy conductive patterns 14c but also around the patterns can be suppressed to prevent the deterioration of the reference capacitors $Q_r$ by adopting a structure, as described above, such that the holes 18f were formed in the second interlayer insulating film 18, which corresponds to areas above the dummy conductive patterns 14c, and the data wiring 23 were connected to the dummy conductive patterns 14c through the holes 18f. Further, experiment has made clear that the deterioration preventing function of the reference capacitors $Q_r$ reduces when it takes longer than 8 μm for the distance between the holes 18d on the reference capacitors $Q_r$ and the holes 18f on the dummy conductive patterns 14c.

Next, description will be made for the arrangement of the plate lines 12a, the plate line connecting sections 12b and the data wiring 23, and the arrangement of the data storage regions.

Figure 12:
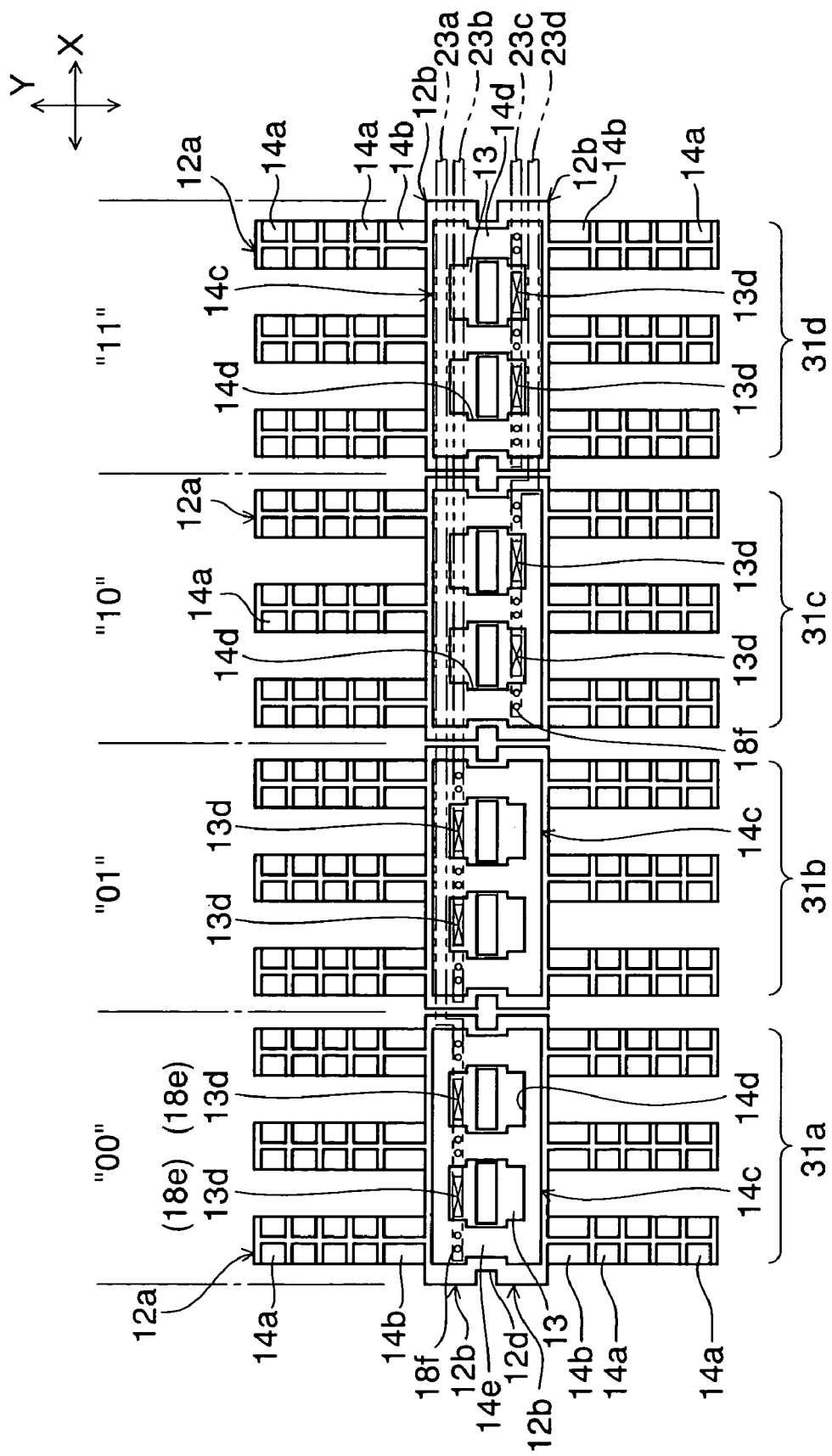
FIG. 12 is a plan view showing the arrangement relation between capacitors and data wiring in the memory cell region of the semiconductor device according to the embodiment of the present invention.

Two plate line connecting sections 12b shown in FIG. 5G are connected to each other via the bridge sections 12d, and a plurality of the plate lines 12a are connected to each plate line connecting section 12b in an opposite direction. Then, as shown in FIG. 12, three plate lines 12a are formed at an interval on one side of the plate line connecting section 12b and three plate lines 12a are formed at an interval on the other side. Consequently, two plate line connecting sections 12b, which are connected via the bridge sections 12d, and six plate lines 12a constitute one data block. The six plate lines 12a are arranged symmetrically by three each by using a virtual axis passing a region between the two plate line connecting sections 12b as a center.

In FIG. 12, first to fourth data blocks (31a to 31d) are formed in the X-direction at an interval. 24 plate lines 12a in the first to fourth data blocks 31a to 31d are arranged substantially parallelly at an interval with each other. Further, the plate line connecting sections 12b of the first to fourth data blocks 31a to 31d are substantially in a same line in the longitudinal direction. Moreover, the first to fourth data blocks (31a to 31d) are apart from each other with a gap.

Among the first to fourth data blocks 31a to 31d, the first data block 31a is the storage region of data "00", the second data block 31b is the storage region of data "01", the third data block 31c is the storage region of data "10", and the fourth data block 31d is the storage region of data "11".

In the first and second data blocks (31a, 31b), the data wiring 23 is connected to the contact region C of the plate line connecting section 12b on one side through the holes 18e of the second interlayer insulating film 18 and the openings 13d of the ferroelectric film 13 shown in FIG. 10. In contrast, the contact region C of the plate line connecting section 12b on the other side is covered with the ferroelectric film 13 and the second interlayer insulating film 18.

Further, in the third and fourth data blocks, the contact region C of the plate line connecting section 12b on one side is covered with the ferroelectric film 13 and the second interlayer insulating film 18. In contrast, the contact region C of the plate line connecting section 12b on the other side is connected to the data wiring 23 through the holes 18e of the second interlayer insulating film 18 and the openings 13d of the ferroelectric film 13 shown in FIG. 10.

Next, description will be made for the connection between the first to fourth data wiring 23a to 23d and the first to fourth data blocks.

For example, the first data wiring 23a for transmitting "00" data signal passes linearly in the X-direction over the dummy conductive patterns 14c on the plate line connecting sections 12b on one side in the second to fourth data blocks 31b to 31d, bends at or near the boundary between the first data block 31a and the second data block 31b, and is connected to the plate line connecting section 12b on one side through the holes 18e of the second interlayer insulating film 18 in the first data block 31a. The reason why the first data wiring 23a is bent is to bypass the contact regions of the second data block 31b.

Further, the second data wiring 23b for transmitting "01" data signal is formed linearly so as to pass over the openings 14d of the dummy conductive patterns 14c on the plate line connecting sections 12b on one side in the third and fourth data blocks 31c, 31d to reach the second data block 31b. Then, the second data wiring 23b is connected to the plate line connecting section 12b on one side through the holes 18e of the second interlayer insulating film 18 in the second data block 31b the second data wiring 23b is not formed in the first data block 31a, and is parallel with the first data wiring 23a at an interval.

The third data wiring 23c for transmitting "11" data signal is connected to the plate line connecting sections 12b on the other side through the holes 18e of the second interlayer insulating film 18 in the fourth data block 31d. The third data wiring 23c is not formed on the first to third data blocks 31a to 31c.

The fourth data wiring 23d for transmitting "10" data signal passes over the dummy conductive patterns on the plate line connecting sections 12b on the other side in the fourth data block 31d, bends at or near the boundary between the third data block 31c and the fourth data block 31d to reach the third data block 31c, and is connected to the plate line connecting section 12b on the other side through the holes 18e of the second interlayer insulating film 18 in the third data block 31c.

Note that the first data wiring 23a is connected to the dummy conductive patterns 14c through the holes 18f of the second interlayer insulating film 18 in the first data block 31a. Similarly, the second data wiring 23b is connected to the dummy conductive patterns 14c of the second data block 31b, the third data wiring 23c is connected to the dummy conductive patterns 14c of the fourth data block 31d, and the fourth data wiring 23d is connected to the dummy conductive patterns 14c of the third data block 31c.

As described above, the dummy conductive patterns 14c are formed in a region between the upper electrodes 14b of the reference capacitors $Q_r$ and the holes 18e of the second interlayer insulating film 18. Therefore, although the first and fourth data wiring 23a, 23d require bent portions that bypass a part of the contact regions, the arrangement order of the first to fourth data wiring 23a to 23d can be the same as that in a structure where the dummy conductive patterns are not formed.

Figure 13:
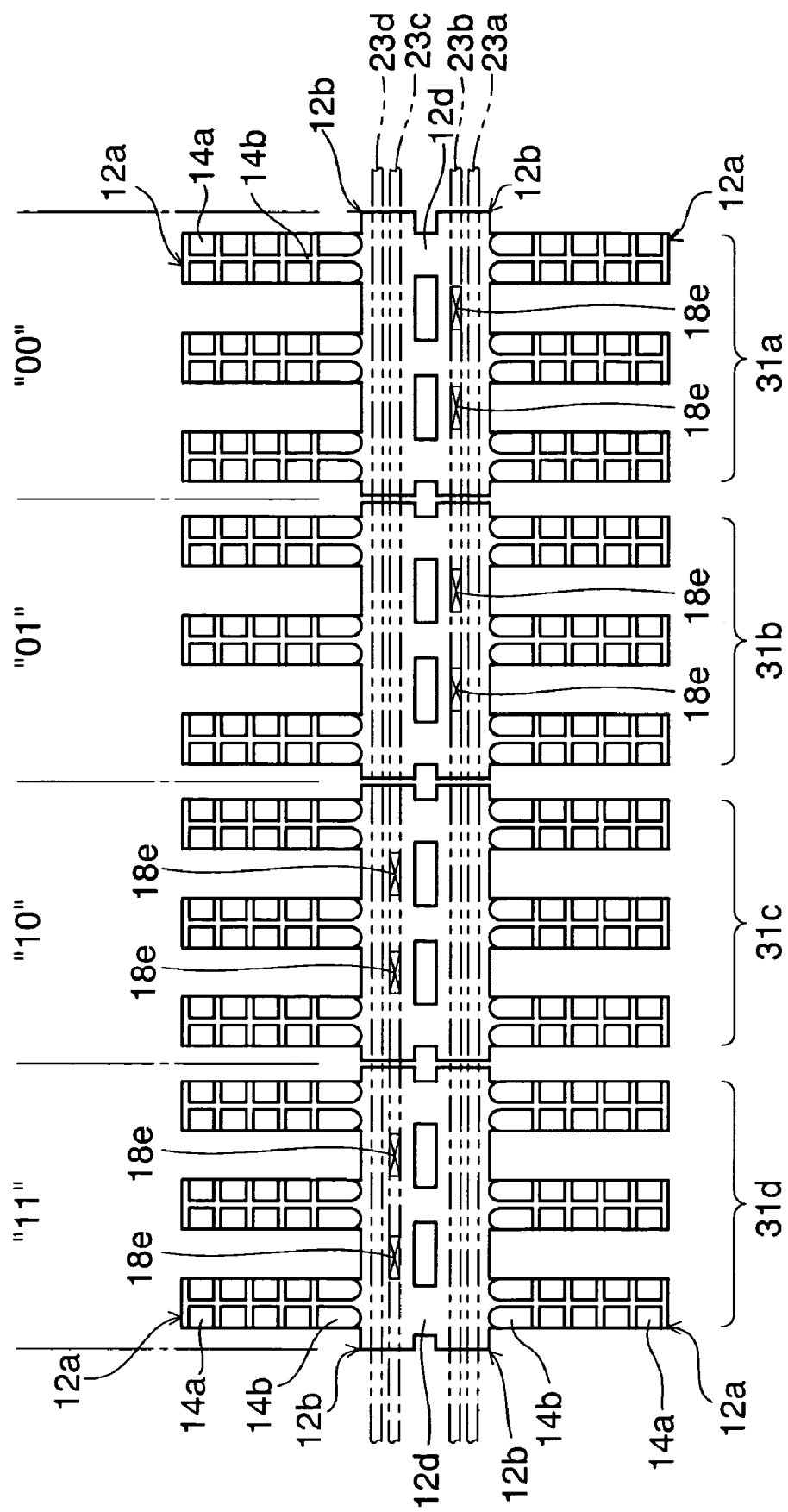
FIG. 13 is a plan view showing the arrangement relation between capacitors and data wiring in the memory cell according to comparative example 1.

The structure of the first to fourth data blocks 31a to 31d having no dummy conductive pattern 14c is as shown in FIG. 13, for example.

In FIG. 13, the arrangement order of the first to fourth data blocks 31a to 31d in the X-direction is reversed to that of FIG. 12, the order of the first to fourth data wiring 23a to 23d are also reversed, and the first to fourth data wiring 23a to 23d are formed parallelly with each other and linearly. Then, the fourth data wiring 23d is connected to the plate line connecting sections 12b in the second data block 31b, the third data wiring 23c is connected to the plate line connecting sections 12b in the fourth data block 31d, and the second data wiring 23b is connected to the plate line connecting sections 12b in the second data block 31b, and the first data wiring 23a is connected to the plate line connecting sections 12b in the first data block 31a. In short, there is no need to bend the first and third data wiring 23a, 23c because no dummy conductive pattern 14c is present.

Figure 14:
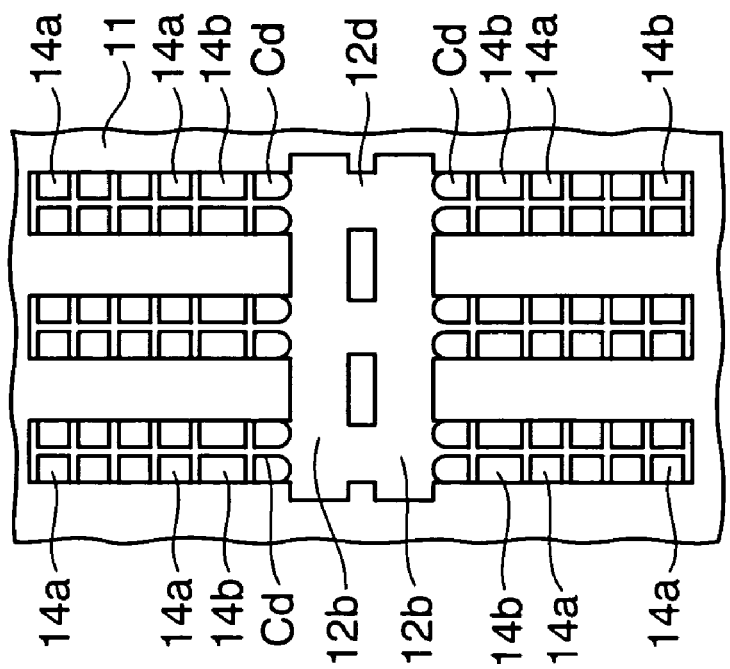
FIG. 14 is a plan view showing the capacitors of the memory cell according to comparative example 2.

Regarding the reference capacitors 14b shown in FIG. 13, the film thickness becomes unstable near the plate line connecting sections 12b, so that it is necessary to form dummy capacitors $Q_d$ adjacent to the reference capacitors $Q_r$ on the plate lines 12b as shown in FIG. 14. However, the dummy capacitors $Q_d$ reduces the degree of integration of the actually-operating capacitors $Q$, $Q_r$ in the memory cell region.

Figure 15:
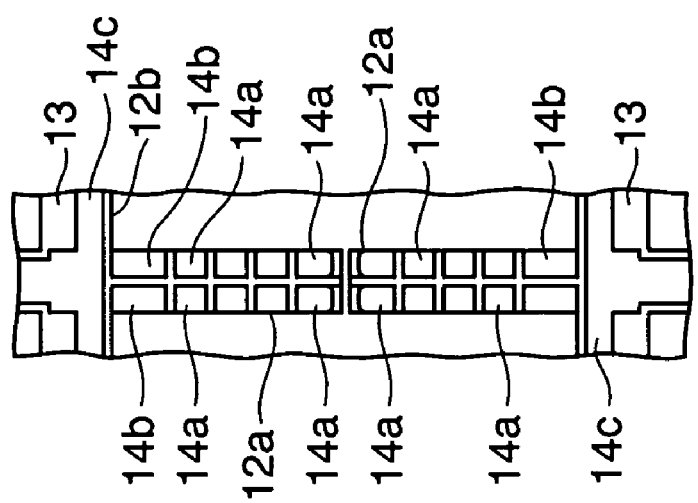
FIG. 15 is a plan view showing a state where the end portions of two plate lines of the memory cell in the semiconductor device according to the embodiment of the present invention are confronted to each other.

Meanwhile, as shown in FIG. 15, since the end portion of a plate line 12a, which is not connected to the plate line connecting section 12b, is confronted to the end portion of another plate line 12a at an interval of approximately 0.3 μm, the unstable region of the film thickness of the upper electrode 14a in the closest capacitor Q to the end portion is within an allowable range.

Although the above-described memory cell shows the structure of the 1T1C type, it can be applied for the 2T2C type structure as well. Specifically, as shown in FIG. 16, the reference capacitors $Q_r$ are only not formed on the plate lines 12a in the memory cell of the 2T2C type with regard to the plate lines 12a, the plate line connecting sections 12b and the structure over them, and the same structure and forming process of the above-described 1T1C type memory cell may be adopted for another structure and the forming process. Thus, there is no need to form the dummy capacitors on the plate lines 12a, and thus it can lead to an improvement of the degree of integration of the effective elements in the memory cell regions. Note that, in FIG. 16, the same symbols as those in FIGS. 5 to 15 denote the same elements.

FIG. 17 shows the plan view where the dummy capacitors are formed on both sides of a region in which the above-described first to fourth data blocks 31a to 31d are gathered.

In FIG. 17, dummy plate lines 12f are parallelly formed with respect to the plate lines 12a at an interval on both sides in a horizontal direction of the region in which the first to fourth data blocks 31a to 31d are gathered. The dummy plate lines 12f are connected electrically to wiring 24 passing over the bridge sections 12d that connect the two plate line connecting sections 12b.

What is claimed is:

1. A semiconductor device comprising:
   a first insulating film being formed over a semiconductor substrate;
   two or more capacitor lower electrodes being formed over said first insulating film so as to extend in a vertical direction and connecting respective one ends thereof to each other in a horizontal direction via conductive connecting sections having contact regions;
   a dielectric film being formed in a region between said contact regions and said capacitor lower electrodes over said conductive connecting sections, and formed over said capacitor lower electrodes;
   capacitor upper electrodes being formed over said dielectric film over said capacitor lower electrodes, and formed in said vertical direction at least in a line; and
   upper conductive patterns being formed over said dielectric film over the conductive connecting sections, in the same layer as said capacitor upper electrodes, and at an interval from said capacitor upper electrode closest to said conductive connecting sections;
   wherein said conductive connecting sections are formed in plural numbers on said first insulating film, and two of said conductive connecting sections adjacent to each other in said vertical direction are arranged in opposite directions to each other.

2. A semiconductor device according to claim 1, wherein the interval between said capacitor upper electrode arranged closest to said conductive connecting sections and said upper conductive patterns is substantially the same as the interval between a plurality of said capacitor upper electrodes over said capacitor lower electrodes.

3. A semiconductor device according to claim 1, wherein a plurality of said capacitor lower electrodes are connected to said conductive connecting sections at an interval in said horizontal direction.

4. A semiconductor device according to claim 1, wherein said conductive connecting sections are made of the same material as said capacitor lower electrodes.

5. A semiconductor device according to claim 1, wherein said two conductive connecting sections adjacent to each other in said vertical direction are connected to each other at a side opposite to a side to which said capacitor lower electrodes are connected.

6. A semiconductor device according to claim 1, wherein said capacitor lower electrode is confronted to the edge of another capacitor lower electrode at a side opposite to a side to which said conductive connecting section is connected.

7. A semiconductor device according to claim 1, wherein said conductive connecting sections are formed in plural numbers in said horizontal direction at an interval from each other.

8. A semiconductor device according to claim 1, wherein, in a plurality of said capacitor upper electrodes formed over said capacitor lower electrodes, said capacitor upper electrode closest to said upper conductive patterns constitutes a reference capacitor together with said dielectric film and said capacitor lower electrode, and the rest of said capacitor upper electrodes constitute a capacitor for storing information together with said dielectric film and said capacitor lower electrodes.

9. A semiconductor device according to claim 1, further comprising:
   a second insulating film covering said capacitor lower electrodes, said conductive connecting sections, said dielectric film, said capacitor upper electrodes, said upper conductive patterns and said first insulating film;
   first holes being formed in said second insulating film over said capacitor upper electrodes;
   second holes being formed in said second insulating film over said upper conductive patterns;
   third holes being formed in said second insulating film over said contact regions of said conductive connecting sections;
   first wiring being formed on said second insulating film, and connected electrically to said capacitor upper electrodes though said first holes; and
   second wiring being formed over said second insulating film, connected electrically to said upper conductive patterns and said conductive connecting sections through said second and third holes, respectively, and passing over said conductive connecting sections.

10. A semiconductor device according to claim 9, wherein said conductive connecting sections are formed in plural numbers at an interval in said horizontal direction, and said second wiring, which is connected electrically to said contact region in one conductive connecting section out of said conductive connecting sections adjacent to each other, has a bent shape that bypasses said contact region in the other conductive connecting section.

11. A semiconductor device according to claim 9, further comprising:
   active elements having impurity diffusion regions formed on the surface layer of said semiconductor substrate;
   fourth holes being formed in said first insulating film and said second insulating film on said impurity diffusion regions; and
   a conductive layer being formed inside said fourth holes and electrically connecting said second wiring to said impurity diffusion regions.

12. A semiconductor device according to claim 11, further comprising:
   word lines being connected electrically to a part of said active element and extending in said horizontal direction under said capacitor lower electrodes.

13. A manufacturing method of a semiconductor device comprising the steps of:
   forming a first insulating film over a semiconductor substrate;
   forming a first conductive film, a dielectric film, and a second conductive film in order over said first insulating film;
   coating resist over said second conductive film;
   patterning said coated resist to form first resist patterns having the planar shape of a capacitor upper electrode in a plate line region at least in a line at an interval in a vertical direction;
   patterning said resist to form second resist patterns, which are adjacent to the closest first resist pattern at an interval in said vertical direction in a connection region connected to the edge of the plate line region and have openings in the contact region of said connection region;
   etching said second conductive film by using said first and second resist patterns as masks to form capacitor upper electrodes, which consist of said second conductive film, under said first resist patterns and to simultaneously form upper conductive patterns, which consist of said second conductive film and to which said contact region is to be open, under said second resist patterns;
   removing said first and second resist patterns;
   patterning said dielectric film to leave said dielectric film at least under said capacitor upper electrodes and said upper conductive patterns;
   patterning said first conductive film to form plate lines that become capacitor lower electrodes in the entirety of said plate line region;
   patterning said first conductive film to form conductive connecting sections, which are wider than said plate lines in a horizontal direction and connected to one ends of the plate lines and exposing said contact regions from said upper conductive patterns and said dielectric film;
   forming an active element, which has impurity diffusion regions in said semiconductor substrate, under said first insulating film;
   forming fourth holes in said first insulating film and said second insulating film over said impurity diffusion regions; and
   forming a conductive film, which connects said first wiring and said impurity diffusion regions electrically, inside said fourth holes.

14. A manufacturing method of a semiconductor device according to claim 13, wherein the interval between said second resist patterns and said first resist patterns is substantially the same as the interval between a plurality of said first resist patterns.

15. A manufacturing method of a semiconductor device according to claim 13, wherein said second resist patterns are formed wider in said horizontal direction than said first resist patterns.

16. A manufacturing method of a semiconductor device according to claim 13, further comprising the step of:
   forming a plurality of said plate lines by connecting to one of said conductive connecting section at an interval in said horizontal direction.

17. A manufacturing method of a semiconductor device according to claim 13, further comprising the steps of:
   forming a second insulating film covering said conductive connecting sections, said plate lines, said dielectric film, said capacitor upper electrodes, and said upper conductive patterns over said first insulating film;
   patterning said second insulating film to form first holes in said second insulating film over said capacitor upper electrodes and to form second holes over the upper conductive patterns, and to form third holes in said conductive connecting sections on a region that does not overlap said upper conductive patterns;
   forming first wiring, that is connected electrically to said capacitor upper electrodes through said first holes, over said second insulating film; and
   forming second wiring over said second insulating film, said second wiring being connected electrically to said upper conductive patterns through said second holes, being connected electrically to the conductive connecting sections through said third holes, and passing over said conductive connecting sections.

18. A manufacturing method of a semiconductor device according to claim 13, wherein, in said plate line regions, said capacitor upper electrode closest to said connecting regions out of a plurality of said capacitor upper electrodes is formed as an upper electrode for a reference capacitor, and the rest of said capacitor upper electrodes are formed as the upper electrodes of a capacitor for storing information.

* * * * *